(12) United States Patent
Martiskainen

(10) Patent No.: US 9,577,602 B2
(45) Date of Patent: Feb. 21, 2017

(54) BROADBAND MATCHING CIRCUITS

(71) Applicant: GALTRONICS CORPORATION LTD., Tiberias (IL)

(72) Inventor: Matti Martiskainen, Tiberias (IL)

(73) Assignee: GALTRONICS CORPORATION, LTD., Tiberias (IL)

( * ) Notice: Subject to any disclaimer, the term of this patent is extended or adjusted under 35 U.S.C. 154(b) by 183 days.

(21) Appl. No.: 14/386,235

(22) PCT Filed: Mar. 19, 2013

(86) PCT No.: PCT/IL2013/050263
§ 371 (c)(1),
(2) Date: Sep. 18, 2014

(87) PCT Pub. No.: WO2013/140405
PCT Pub. Date: Sep. 26, 2013

(65) Prior Publication Data
US 2015/0048992 A1 Feb. 19, 2015

Related U.S. Application Data

(60) Provisional application No. 61/612,628, filed on Mar. 19, 2012.

(51) Int. Cl.
*H01Q 1/50* (2006.01)
*H03H 7/38* (2006.01)
(Continued)

(52) U.S. Cl.
CPC .................. *H03H 7/38* (2013.01); *H01Q 1/00* (2013.01); *H01Q 21/0006* (2013.01);
(Continued)

(58) Field of Classification Search
CPC ........ H03H 7/38; H03H 7/0115; H03H 7/175; H03H 7/1725; H01Q 21/0006; H01Q 1/00
(Continued)

(56) References Cited

U.S. PATENT DOCUMENTS 6,121,940 A   9/2000 Skahill et al.
6,249,687 B1 * 6/2001 Thomsen ................ H01P 1/213
                                                    375/316

(Continued)

FOREIGN PATENT DOCUMENTS

WO    2013/140405 A1   9/2013

OTHER PUBLICATIONS

An International Search Report and Written Opinion both dated Jul. 1, 2013, which issued during the prosecution of Applicant's PCT/IL2013/050263.

(Continued)

*Primary Examiner* — Hoanganh Le
(74) *Attorney, Agent, or Firm* — Lorenz & Kopf, LLP.

(57) ABSTRACT

An antenna system including a signal source, at least one antenna coupled to the signal source, a matching circuit connected to the signal source at a first port and to the at least one antenna at a second port and operative to match the at least one antenna to the signal source, the matching circuit having a characteristic impedance with respect to the first port and the second port, real and imaginary parts of the characteristic impedance not being defined by the Hilbert transform.

10 Claims, 18 Drawing Sheets

(51) Int. Cl.
  *H01Q 1/00* (2006.01)
  *H01Q 21/00* (2006.01)
  *H03H 7/01* (2006.01)

(52) U.S. Cl.
  CPC .......... *H03H 7/0115* (2013.01); *H03H 7/175* (2013.01); *H03H 7/1725* (2013.01); *H03H 7/1733* (2013.01); *H03H 7/1766* (2013.01); *H03H 7/1783* (2013.01); *H03H 7/1791* (2013.01)

(58) Field of Classification Search
  USPC .................................. 343/852, 850; 333/124
  See application file for complete search history.

(56) References Cited

U.S. PATENT DOCUMENTS

| | | | |
|---|---|---|---|
| 7,239,853 B2 | 7/2007 | Kearns | |
| 7,817,966 B2 * | 10/2010 | Prikhodko | H01P 1/15 455/277.1 |
| 7,831,210 B1 * | 11/2010 | Freeman | H04B 1/0057 333/133 |
| 8,098,114 B2 | 1/2012 | Fukuda et al. | |
| 2011/0163935 A1 | 7/2011 | De Jongh et al. | |

OTHER PUBLICATIONS

An International Preliminary Report on Patentability dated Sep. 23, 2014, which issued during the prosecution of Applicant's PCT/IL2013/050263.
U.S. Appl. No. 61/612,628, filed Mar. 19, 2012.

* cited by examiner

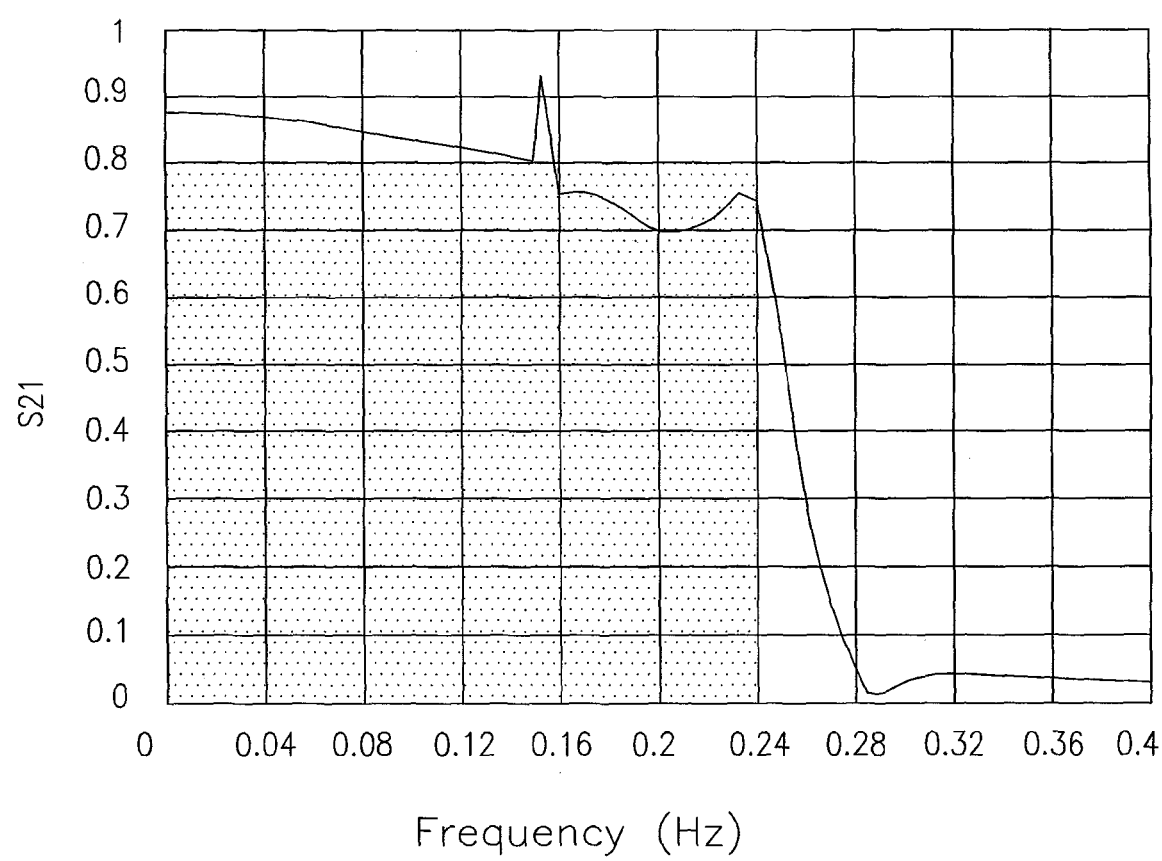

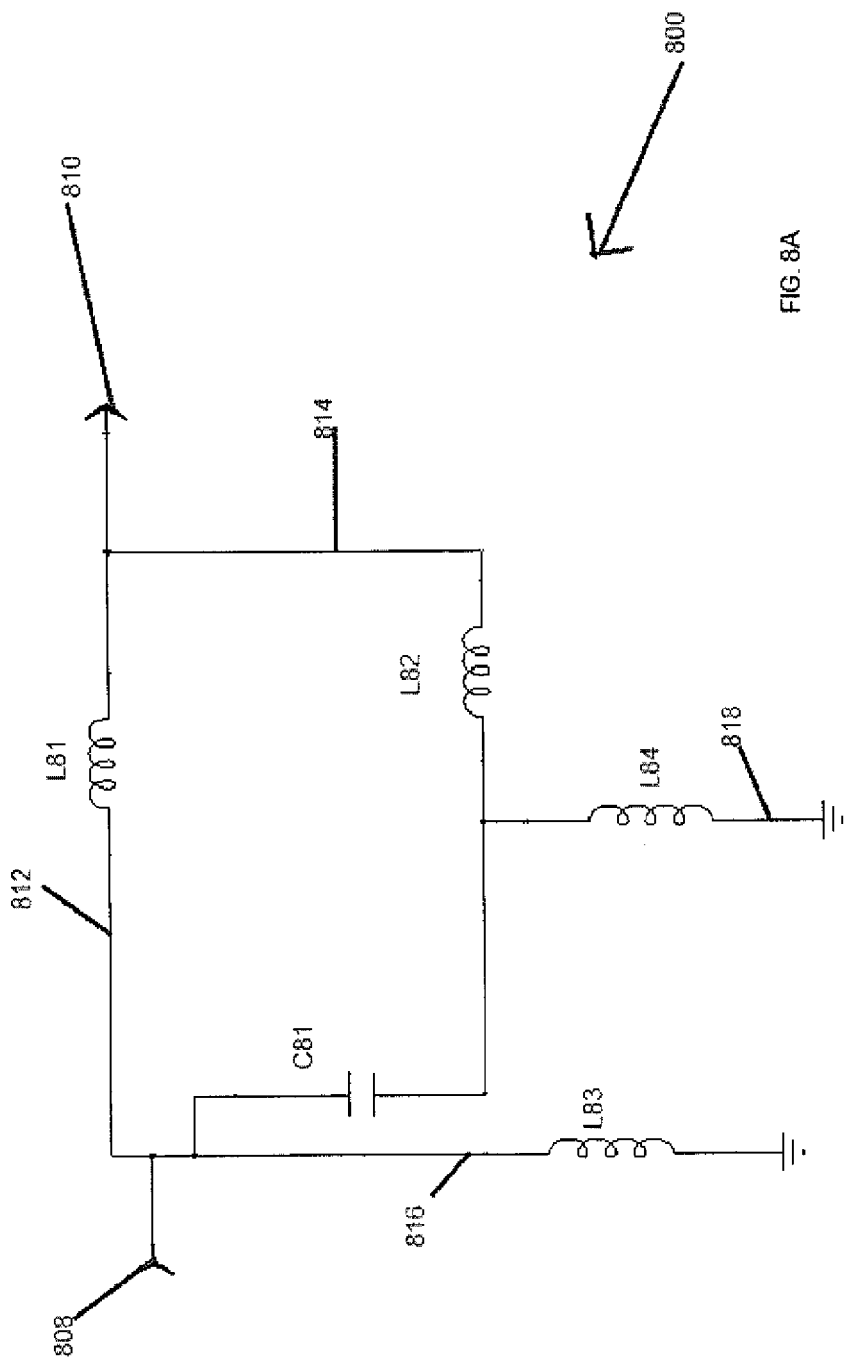

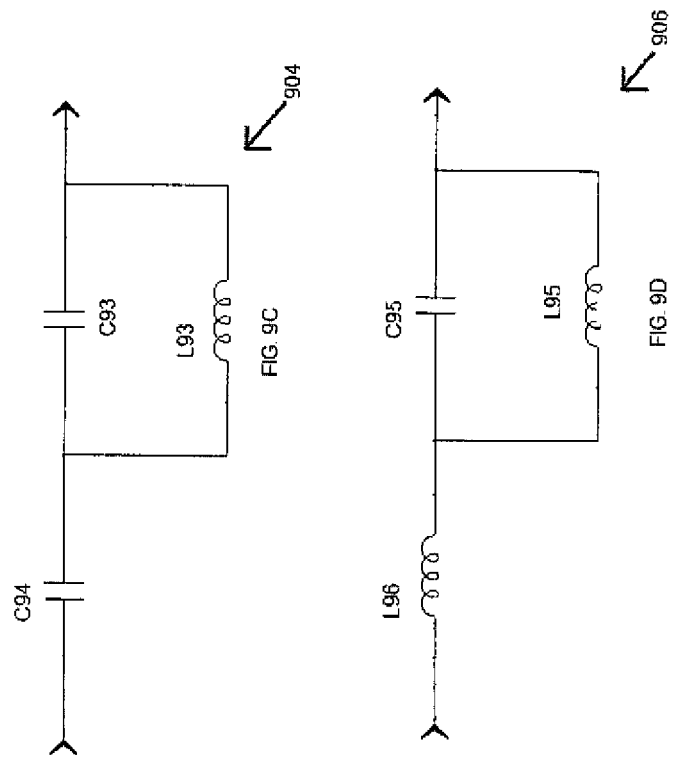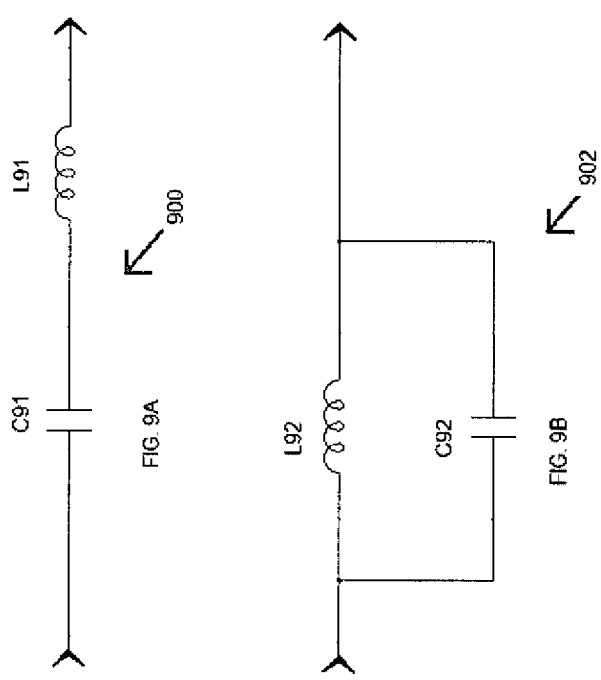

BROADBAND MATCHING CIRCUITS

REFERENCE TO RELATED APPLICATIONS

Reference is hereby made to U.S. Provisional Patent Application 61/612,628, entitled LOW LOSS WIDEBAND MATCHING CIRCUIT, filed Mar. 19, 2012, the disclosure of which is hereby incorporated by reference and priority of which is hereby claimed pursuant to 37 CFR 1.78(a)(4) and (5)(i).

FIELD OF THE INVENTION

The present invention relates generally to matching circuits and more particularly to broadband matching circuits.

BACKGROUND OF THE INVENTION

The following publications are believed to represent the current state of the art:
H. W. Bode, 'Network Analysis and Feedback Amplifier Design,' D. Van Nostrand Company, Inc., Princeton, N.J.; 1945;
H. J. Carlin, 'A new approach to gain bandwidth problems,' IEEE Trans. on Circuits and Systems, vol. CAS-24, no. 4, pp. 170-175, April 1977;
H. J. Carlin and B. S. Yarman, Wideband Circuit Design, CRC Press, Boca Raton, Fla., 1997;
E. H. Newman, 'Real frequency wide-band impedance matching with nonminimum reactance equalizers,' IEEE Trans. Antennas and Propagation, vol. 53, no. 11, pp. 3597-3603, November 2005.

SUMMARY OF THE INVENTION

The present invention seeks to provide improved low loss broadband matching circuits for use in source-load systems.

There is thus provided in accordance with a preferred embodiment of the present invention an antenna system including a signal source, at least one antenna coupled to the signal source, a matching circuit connected to the signal source at a first port and to the at least one antenna at a second port and operative to match the at least one antenna to the signal source, the matching circuit having a characteristic impedance with respect to the first port and the second port, real and imaginary parts of the characteristic impedance not being defined by the Hilbert transform.

Preferably, the matching circuit includes at least two branches providing multiple current paths between the signal source and the at least one antenna.

Preferably, the multiple current paths include parallel paths.

Preferably, at least one of the at least two branches includes at least one inductor and capacitor.

Preferably, the at least one inductor and capacitor include one inductor and one capacitor connected in series and operative as a resonant inductor-capacitor circuit.

Preferably, an impedance of the one inductor and one capacitor connected in series is given by $(L*C*(s^2+1))/C*s$, where L is an inductance of the inductor, C is a capacitance of the capacitor and $s=j2\pi f$, where f is a frequency of operation of the signal source.

Additionally or alternatively, the at least one inductor and capacitor includes one inductor and one capacitor connected in parallel and operative as a resonant inductor-capacitor circuit.

Preferably, an impedance of the one inductor and one capacitor connected in parallel is given by $L*s/(L*C*(s^2+1))$ where L is an inductance of the inductor, C is a capacitance of the capacitor and $s=j2\pi f$, where f is a frequency of operation of the signal source.

Additionally or alternatively, the at least one inductor and capacitor includes an inductor and a first capacitor connected in parallel and a second capacitor connected in series therewith, the inductor, first capacitor and second capacitor being operative as a resonant inductor-capacitor circuit.

Preferably, an impedance of the inductor, first capacitor and second capacitor is given by $[((L*C2)+C1)*(s^2+1))]/[s*(L*C2*C1*2(s^2+C1))]$ where L is an inductance of the inductor, C1 is a capacitance of the first capacitor, C2 is a capacitance of the second capacitor and $s=j2\pi f$, where f is a frequency of operation of the signal source.

Additionally or alternatively, the at least one inductor and capacitor includes a first inductor and a capacitor connected in parallel and a second inductor connected in series therewith, the first inductor, capacitor and second inductor being operative as a resonant inductor-capacitor circuit.

Preferably, an impedance of the first inductor, capacitor and second inductor is given by $Z=s*[L2*L1*C*s^2+(L1+L2)]/(L1*C*s+1)$ where L1 is an inductance of the first inductor, C is a capacitance of the capacitor, L2 is an inductance of the second inductor and $s=j2\pi f$, where f is a frequency of operation of the signal source.

There is further provided in accordance with another preferred embodiment of the present invention an antenna system including a signal source operative to provide a radio-frequency signal over a predetermined frequency range, the predetermined frequency range including a plurality of frequency sub-ranges, at least one antenna coupled to the signal source and a matching circuit coupled to the at least one antenna and to the signal source and operative to match the at least one antenna to the signal source, the at least one matching circuit including at least two parallel branches, at least one of the at least two parallel branches including at least one inductor and capacitor, each one of the at least two parallel branches being operative to match the at least one antenna to the signal source in at least one frequency sub-range of the plurality of frequency sub-ranges, without switches.

Preferably, the matching circuit includes a multiband matching circuit.

Preferably, the at least one inductor and capacitor includes one inductor and one capacitor connected in series and operative as a resonant inductor-capacitor circuit.

Preferably, an impedance of the one inductor and one capacitor connected in series is given by $(L*C*(s^2+1))/C*s$, where L is an inductance of the inductor, C is a capacitance of the capacitor and $s=j2\pi f$, where f is a frequency of operation of the signal source.

Additionally or alternatively, the at least one inductor and capacitor includes one inductor and one capacitor connected in parallel and operative as a resonant inductor-capacitor circuit.

Preferably, an impedance of the one inductor and one capacitor connected in parallel is given by $L*s/(L*C*(s^2+1))$ where L is an inductance of the inductor, C is a capacitance of the capacitor and $s=j2\pi f$, where f is a frequency of operation of the signal source.

Additionally or alternatively, the at least one inductor and capacitor includes an inductor and a first capacitor connected in parallel and a second capacitor connected in series therewith, the inductor, first capacitor and second capacitor being operative as a resonant inductor-capacitor circuit.

Preferably, an impedance of the inductor, first capacitor and second capacitor is given by $[((L*C2)+C1)*(s^2+1))]/[s*(L*C2*C1*2(s^2+C1))]$ where T, is an inductance of the inductor, C1 is a capacitance of the first capacitor, C2 is a capacitance of the second capacitor and $s=j2\pi f$, where f is a frequency of operation of the signal source.

Additionally or alternatively, the at least one inductor and capacitor includes a first inductor and a capacitor connected in parallel and a second inductor connected in series therewith, the first inductor, capacitor and second inductor being operative as a resonant inductor-capacitor circuit.

Preferably, an impedance of the first inductor, capacitor and second inductor is given by $Z=s*[L2*L1*C*s^2+(L1+L2)]/(L1*C*s+1)$ where L1 is an inductance of the first inductor, C is a capacitance of the capacitor, L2 is an inductance of the second inductor and $s=j2\pi f$, where f is a frequency of operation of the signal source.

There is yet further provided in accordance with yet another preferred embodiment of the present invention an antenna system including a signal source operative to provide a radio-frequency signal over a predetermined frequency range, at least one antenna coupled to the signal source and a matching circuit coupled to the at least one antenna and to the signal source and operative to match the at least one antenna to the signal source over the predetermined frequency range, the at least one matching circuit including at least two branches providing multiple current paths between the signal source and the at least one antenna.

Preferably, at least one of the at least two branches includes at least one inductor and capacitor.

Preferably, the at least one inductor and capacitor includes one inductor and one capacitor connected in series and operative as a resonant inductor-capacitor circuit.

Preferably, an impedance of the one inductor and one capacitor connected in series is given by $(L*C*(s^2+1))/C*s$, where L is an inductance of the inductor, C is a capacitance of the capacitor and $s=j2\pi f$, where f is a frequency of operation of the signal source.

Additionally or alternatively, the at least one inductor and capacitor includes one inductor and one capacitor connected in parallel and operative as a resonant inductor-capacitor circuit.

Preferably, an impedance of the one inductor and one capacitor connected in parallel is given by $L*s/(L*C*(s^2+1))$ where L is an inductance of the inductor, C is a capacitance of the capacitor and $s=j2\pi f$, where f is a frequency of operation of the signal source.

Additionally or alternatively, the at least one inductor and capacitor includes an inductor and a first capacitor connected in parallel and a second capacitor connected in series therewith, the inductor, first capacitor and second capacitor being operative as a resonant inductor-capacitor circuit.

Preferably, an impedance of the inductor, first capacitor and second capacitor is given by $[((L*C2)+C1)*(s^2+1))]/[s*(L*C2*C1*2(s^2+C1))]$ where L is an inductance of the inductor, C1 is a capacitance of the first capacitor, C2 is a capacitance of the second capacitor and $s=j2\pi f$, where f is a frequency of operation of the signal source.

Additionally or alternatively, the at least one inductor and capacitor includes a first inductor and a capacitor connected in parallel and a second inductor connected in series therewith, the first inductor, capacitor and second inductor being operative as a resonant inductor-capacitor circuit.

Preferably, an impedance of the first inductor, capacitor and second inductor is given by $Z=s*[L2*L1*C*s^2+(L1+L2)]/(L1*C*s+1)$ where L1 is an inductance of the first inductor, C is a capacitance of the capacitor, L2 is an inductance of the second inductor and $s=j2\pi f$, where f is a frequency of operation of the signal source.

Further in accordance with a preferred embodiment of the present invention, the matching circuit is operative to provide a single current path between the signal source and the at least one antenna.

Preferably, at least one branch of the matching circuit includes at least one inductor and capacitor.

Preferably, the at least one inductor and capacitor includes one inductor and one capacitor connected in series and operative as a resonant inductor-capacitor circuit.

Preferably, an impedance of the one inductor and one capacitor connected in series is given by $(L*C*(s^2+1))/C*s$, where L is an inductance of the inductor, C is a capacitance of the capacitor and $s=j2\pi f$, where f is a frequency of operation of the signal source.

Additionally or alternatively, the at least one inductor and capacitor includes one inductor and one capacitor connected in parallel and operative as a resonant inductor-capacitor circuit.

Preferably, an impedance of the one inductor and one capacitor connected in parallel is given by $L*s/(L*C*(s^2+1))$ where L is an inductance of the inductor, C is a capacitance of the capacitor and $s=j2\pi f$, where f is a frequency of operation of the signal source.

Additionally or alternatively, the at least one inductor and capacitor includes an inductor and a first capacitor connected in parallel and a second capacitor connected in series therewith, the inductor, first capacitor and second capacitor being operative as a resonant inductor-capacitor circuit.

Preferably, an impedance of the inductor, first capacitor and second capacitor is given by $[((L*C2)+C1)*(s^2+1))]/[s*(L*C2*C1*2(s^2+C1))]$ where L is an inductance of the inductor, C1 is a capacitance of the first capacitor, C2 is a capacitance of the second capacitor and $s=j2\pi f$, where f is a frequency of operation of the signal source.

Additionally or alternatively, the at least one inductor and capacitor includes a first inductor and a capacitor connected in parallel and a second inductor connected in series therewith, the first inductor, capacitor and second inductor being operative as a resonant inductor-capacitor circuit.

Preferably, an impedance of the first inductor, capacitor and second inductor is given by $Z=s*[L2*L1*C*s^2+(L1+L2)]/(L1*C*s+1)$ where L1 is an inductance of the first inductor, C is a capacitance of the capacitor, L2 is an inductance of the second inductor and $s=j2\pi f$, where f is a frequency of operation of the signal source.

There is additionally provided in accordance with another preferred embodiment of the present invention a source-load system including a signal source, at least one load coupled to the signal source and a matching circuit connected to the signal source at a first port and to the at least one load at a second port and operative to match the at least one load to the signal source, the matching circuit having a characteristic impedance with respect to the first port and the second port, real and imaginary parts of the characteristic impedance not being defined by the Hilbert transform.

BRIEF DESCRIPTION OF THE DRAWINGS

The present invention will be understood and appreciated more fully from the following detailed description, taken in conjunction with the drawings in which:

FIGS. 7B and 7C are simplified graphs showing performances of a matching circuit of the type shown in FIG. 7A; and FIG. 8A is a schematic circuit diagram of a matching circuit constructed and operative in accordance with another preferred embodiment of the present invention;

FIGS. 9A, 9B, 9C and 9D are schematic circuit diagrams of alternative embodiments of circuit structures useful in a matching circuit of any of the types illustrated in FIGS. 1-8A, constructed and operative in accordance with a preferred embodiment of the present invention.

DETAILED DESCRIPTION OF PREFERRED EMBODIMENTS

Figure 1:
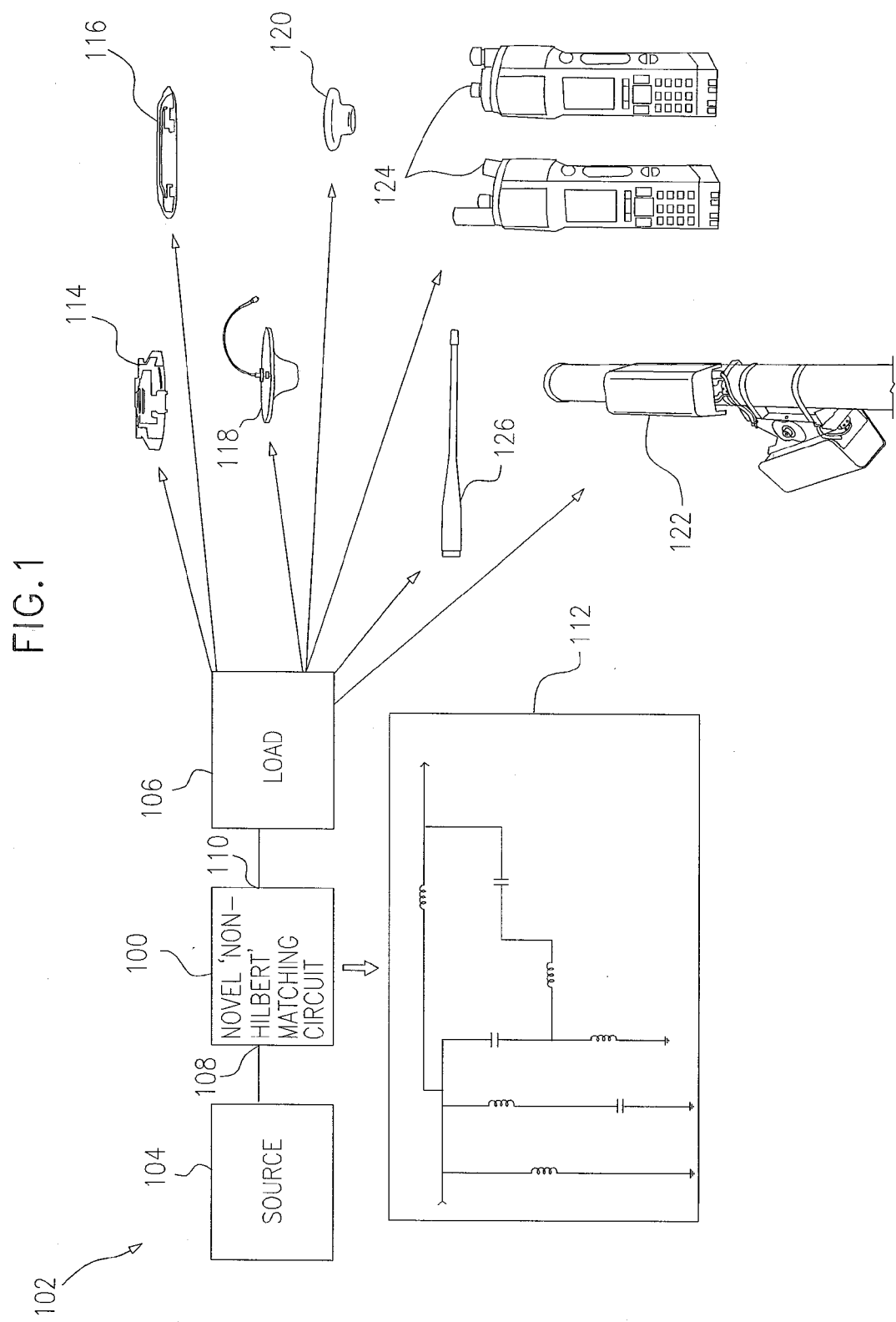
FIG. 1 is a partially schematic, partially pictorial illustration of a matching circuit constructed and operative in accordance with a preferred embodiment of the present invention, in the context of a source-load system.

Reference is now made to FIG. 1, which is a partially schematic, partially pictorial illustration of a matching circuit constructed and operative in accordance with a preferred embodiment of the present invention, in the context of a source-load system.

As seen in FIG. 1, there is provided a matching circuit 100 shown in the context of a source-load system 102. Source-load system 102 preferably comprises a signal source 104 and at least one load 106 coupled thereto. Source-load system 102 preferably comprises an antenna system, wherein at least one load 106 may be embodied as at least one of a variety of antennas, as illustrated in FIG. 1. Alternatively, source-load system 102 may comprise a source-load system other than an antenna system.

Matching circuit 100 is preferably connected to signal source 104 at a first, input port 108 and to at least one load 106, here embodied by way of example as at least one antenna, at a second, output port 110. Matching circuit 100 thus has a characteristic impedance with respect to both first port 108 and second port 110.

Matching circuit 100 is preferably operative to match at least one load 106, here embodied by way of example as an antenna, to signal source 104 over a predetermined frequency range. It is a particular feature of a preferred embodiment of the present invention that the real and imaginary parts of the characteristic impedance of matching circuit 100 with respect to the first and second ports 108 and 110 are not defined by the Hilbert transform. This is in contrast to conventional matching circuits for antennas in which design of the matching circuit is typically constrained by the requirement of the real and imaginary parts of the impedance of the matching circuit being defined by the Hilbert transform. As a result of the real and imaginary parts of the characteristic impedance of matching circuit 100 not being defined by the Hilbert transform, matching circuit 100 is capable of providing improved matching over widened bandwidths in comparison to conventional matching circuits, as will be detailed henceforth.

In particular, matching circuit 100 provides improved impedance matching in comparison to conventional matching circuits designed using the Real Frequency Technique (RFT). A fundamental limitation of RFT is the requirement that both the real and imaginary parts of the impedance of a matching circuit must be defined by the Hilbert transform. This means that in designing a matching circuit using RFT, only one of the real and imaginary parts of the impedance of the matching circuit may be selected, since the other one of the real and imaginary parts of the matching network impedance is automatically defined as a result of the Hilbert transform. This constraint imposes a fundamental restriction on the possible bandwidth of matching circuits designed using RFT.

In contrast, the real and imaginary parts of the characteristic impedance of the matching circuit of the present invention are not related by the Hilbert transform. Selecting one of the real and imaginary parts of the desired impedance of matching circuit 100 in designing matching circuit 100 therefore does not automatically define the other. This allows greater flexibility in selection of impedance values of matching circuit 100 and results in improved broadband matching performance of matching circuit 100.

It is a further particular feature of the present invention that although the matching circuit of the present invention is not limited by the constraints of RFT, an intermediate version of the matching circuit of the present invention may nonetheless be developed using well known RFT methods. The intermediate matching circuit thus generated may then be modified and further optimized in accordance with a preferred embodiment of the present invention, so as to improve its performance. The matching circuit of the present invention thus offers improved performance in comparison to matching circuits designed using RFT, although nonetheless making use of the simplicity and efficiency of design offered by RFT. Further details concerning the optimization of preferred embodiments of matching circuits of the present invention are set forth below in relation to individual embodiments of matching circuit 100 as detailed in FIGS. 2A-8A.

A first preferable exemplary embodiment 112 of matching circuit 100 is illustrated in FIG. 1. It is understood, however, that particular embodiment 112 is included in FIG. 1 by way of example only and that matching circuit 100 may have a wide variety of topologies, including multiple current path and single current path topologies, providing broadband impedance matching over a range of operating frequencies.

As a result of its improved broadband performance, matching circuit 100 may be useful with a wide variety of antennas and antenna systems including, by way of example only, a mobile phone internal antenna 114, a smart phone internal antenna 116, a broadband Distributed Antenna System (DAS) antenna 118, an external small cell antenna 120, an outdoor small cell antenna system 122, an internal antenna for a Land Mobile Radio (LMR) 124 and an external antenna for an LMR 126. Matching circuit 100 may be particularly useful in small cell antenna systems, such as Scalable Multi-Access Small Cell Systems, in which the size of the antenna is very small compared to its operating wavelength and broadband matching is required over exemplary frequency ranges including 3G, 3G+WiFi and LTE/4G (700-3500 MHz); in cell phones in which antennas are required to operate over a very wide frequency spectrum including GSM 800/900/1800/1900, GPRS, EDGE, HSPA, LTE, UMTS and EDGE/GSM ranges; in DAS in which extremely broadband antennas covering frequency ranges of 350-6000 MHz are required; and in video broadcasting in which a wide transmission frequency range is required.

It is understood, however, that these exemplary applications of the broadband matching circuit of the present invention are in no way limiting and that the broadband matching circuit of the present invention may be employed in any antenna system benefiting from broadband impedance matching.

Furthermore, it will be readily appreciated by one skilled in the art, that matching circuit 100 is not limited to use in antenna systems. Rather, matching circuit 100 may be used for providing matching in any source-load system benefiting from broadband matching, including, by way of example, for providing matching between a pre-amplifier and amplifier. Furthermore, due to its enhanced performance as will be detailed henceforth, matching circuit 100 may also be useful in reducing unwanted interference signals between neighboring frequency bands.

Figure 2A:
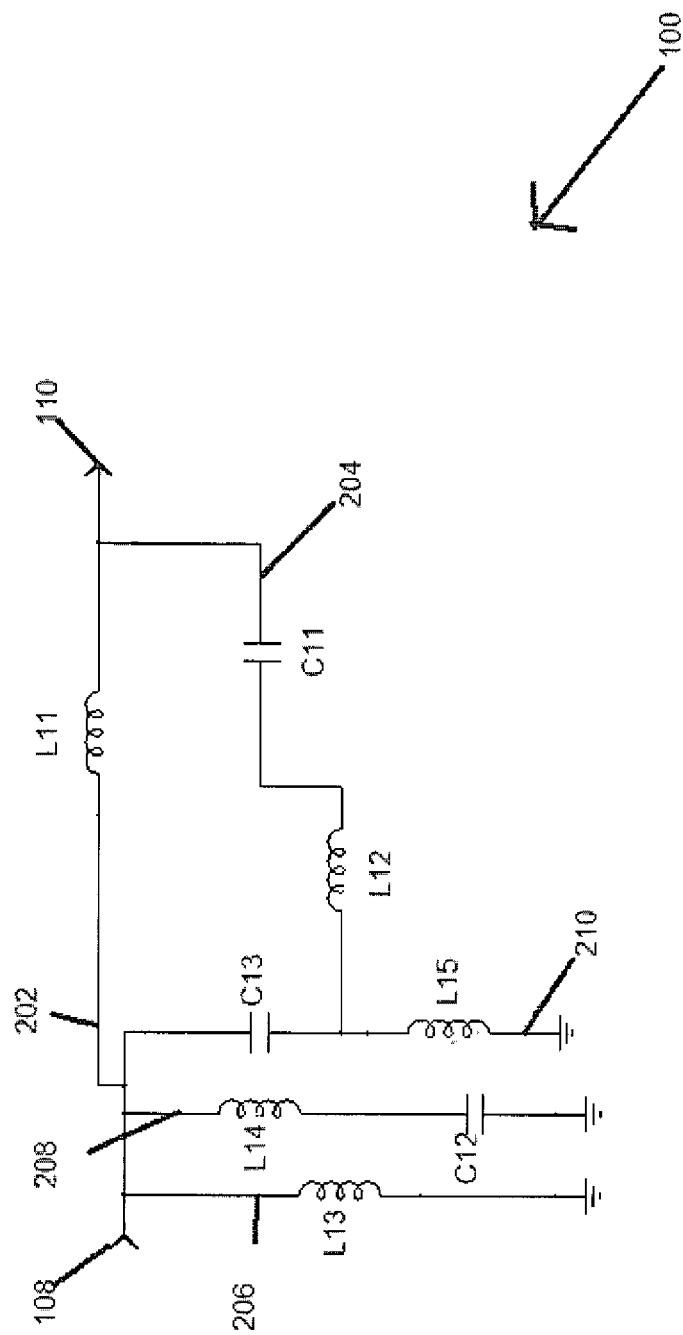
FIG. 2A is a schematic circuit diagram of a matching circuit of the type shown in FIG. 1.
Figure 2B:
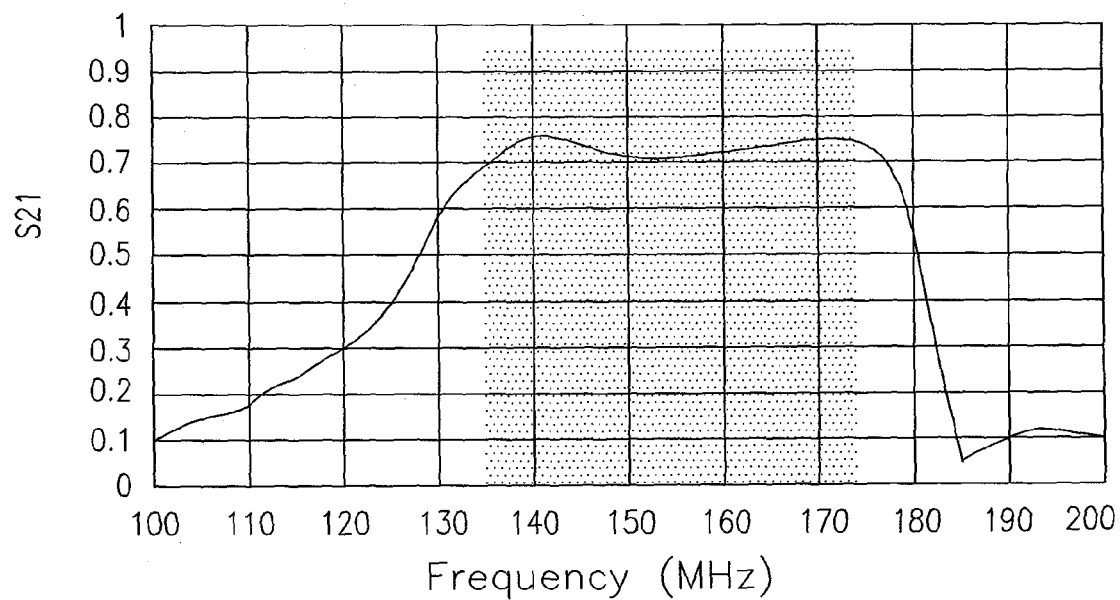
FIGS. 2B and 2C are simplified graphs showing performances of a matching circuit of the type shown in FIG. 2A.
Figure 2C:
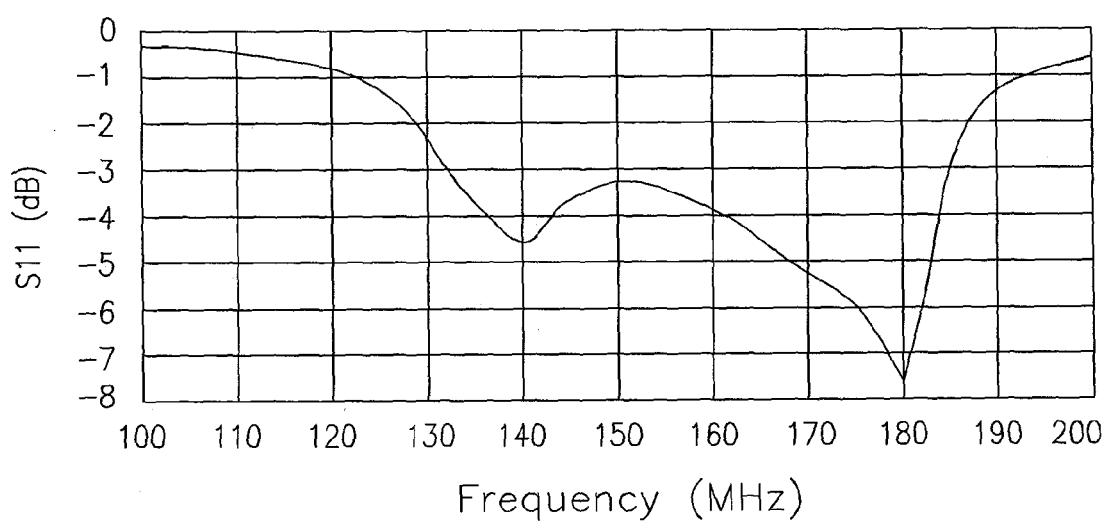

Reference is now made to FIG. 2A which is a schematic circuit diagram of a matching circuit of the type shown in FIG. 1, and to FIGS. 2B and 2C, which are simplified graphs showing performances of a matching circuit of the type shown in FIG. 2A.

As seen in FIG. 2A, there is provided matching circuit 100, preferably connected to first, input port 108 and to second, output port 110. Matching circuit 100 preferably receives an input signal at first port 108 from a signal source (not shown) operative to provide a radio-frequency (RF) signal over a predetermined frequency range. Matching circuit 100 preferably delivers an output signal to second port 110, which output signal is preferably delivered to an antenna (not shown). Matching circuit 100 is preferably operative to match the impedance of the antenna to the impedance of the signal source over the predetermined frequency range of the signal source, in order to maximize the energy transfer between the signal source and the antenna.

Matching circuit 100 preferably includes a first inductor L11 preferably positioned along a first parallel branch 202 thereof and a second inductor L12 and a first capacitor C11 preferably positioned along a second parallel branch 204 thereof. Matching circuit 100 further preferably includes a third inductor L13 preferably positioned along a first shunt branch 206, a fourth inductor L14 and a second capacitor C12 preferably positioned along a second shunt branch 208 and a fifth inductor L15 and a third capacitor C13 preferably positioned along a third shunt branch 210.

Inductors L11-L15 preferably comprise coils. The respective inductance and capacitance values of inductors L11-L15 and capacitors C11-C13 are preferably selected in accordance with the impedance values of the source and antenna to which the source is matched. By way of example, L11 preferably has an inductance of approximately 60.2 nH, L12 an inductance of approximately 892.3 nH, L13 an inductance of approximately 23.8 nH, L14 an inductance of approximately 10.0 nH and L15 an inductance of approximately 27.8 nH. Further by way of example, C11 preferably has a capacitance of approximately 0.8 pF, C12 a capacitance of approximately 23.3 pF and C13 a capacitance of approximately 9.6 pF.

Matching circuit 100 may be adapted to match an antenna having a reactance of approximately zero and a resistance of approximately 16 Ohms at a frequency of approximately 168 MHz. It is understood, however, that matching circuit 100 may be modified by one skilled in the art so as to match antennas having a variety of impedances. It is further understood that the above-listed component values of inductors L11-L15 and capacitors C11-C13 are exemplary only and may be readily scaled according to the frequency range over which matching circuit 100 preferably operates.

As is appreciated from consideration of the topology of matching circuit 100, matching circuit 100 preferably comprises a multiple branch matching circuit, its multiple branches here including, by way of example, first branch 202 and second branch 204 parallel to the first branch 202. Due to the presence of first and second parallel branches 202 and 204, matching circuit 100 preferably provides multiple current paths between first port 108 and second port 110, and thus between the signal source and the antenna.

The provision by matching circuit 100 of multiple current paths between the signal source and the antenna is a highly advantageous feature of a preferred embodiment of the present invention. This is because the Hilbert transform, which is a function relating the real and the imaginary parts of the impedance of conventional matching circuits, fails in the case of a multiple current path matching circuit. As a result of the inclusion of multiple current paths in matching circuit 100, the real and imaginary parts of the impedance of matching circuit 100 are no longer defined by the Hilbert transform and thus may be more freely selected and optimized.

The provision of multiple current paths by matching circuit 100 is in contrast to conventional matching circuits designed using RFT, which conventional matching circuits typically provide only a single current path having only a single reactive component positioned therealong between the signal source and the antenna. Matching circuits designed using RFT are therefore constrained to have impedances whose real and imaginary parts are defined by the Hilbert transform.

Measured values for the real and imaginary parts of the impedance of matching circuit 100 as seen at the first port 108 and the second port 110 over a frequency range of 100-200 MHz are shown in Table 1. As may be calculated by one skilled in the art based on the values displayed in Table 1, the real and imaginary parts of the impedance of matching circuit 100 as seen at first and second ports 108 and 110 are not related by the Hilbert transform.

TABLE 1

| Frequency (MHz) | Real part of impedance (port 1, Ω) | Imaginary part of impedance (port 1, Ω) | Real part of impedance (port 2, Ω) | Imaginary part of impedance (port 1, Ω) |
| --- | --- | --- | --- | --- |
| 100 | 0.686 | 25.987 | 9.924 | 58.986 |
| 102.5 | 0.819 | 28.005 | 10.915 | 60.859 |
| 105 | 0.984 | 30.238 | 12.02 | 62.76 |
| 107.5 | 1.11 | 32.909 | 13.255 | 64.687 |
| 110 | 1.432 | 36.079 | 14.64 | 66.633 |

TABLE 1-continued

| Frequency (MHz) | Real part of impedance (port 1, Ω) | Imaginary part of impedance (port 1, Ω) | Real part of impedance (port 2, Ω) | Imaginary part of impedance (port 1, Ω) |
|---|---|---|---|---|
| 112.5 | 1.918 | 39.857 | 16.195 | 68.59 |
| 115 | 2.382 | 44.592 | 17.946 | 70.547 |
| 117.5 | 3.686 | 50.837 | 19.919 | 72.485 |
| 120 | 5.458 | 59.468 | 22.147 | 74.38 |
| 122.5 | 9.572 | 71.718 | 24.661 | 76.198 |
| 125 | 17.404 | 90.653 | 27.497 | 77.893 |
| 127.5 | 40.188 | 123.823 | 30.688 | 79.403 |
| 130 | 135.285 | 170.629 | 34.26 | 80.647 |
| 132.5 | 281.994 | −21.259 | 38.231 | 81.522 |
| 135 | 96.93 | −113.472 | 42.593 | 81.9 |
| 137.5 | 38.923 | −68.827 | 47.305 | 81.63 |
| 140 | 23.037 | −42.641 | 52.272 | 80.547 |
| 142.5 | 16.293 | −27.859 | 57.332 | 78.49 |
| 145 | 12.005 | −16.536 | 62.245 | 75.332 |
| 147.5 | 10.13 | −7.479 | 66.699 | 71.02 |
| 150 | 9.441 | 0.383 | 70.338 | 65.62 |
| 152.5 | 9.553 | 7.647 | 72.825 | 59.342 |
| 155 | 10.358 | 14.983 | 73.913 | 52.528 |
| 157.5 | 12.057 | 22.897 | 73.51 | 45.596 |
| 160 | 15.325 | 32.232 | 71.7 | 38.952 |
| 162.5 | 20.944 | 44.394 | 68.711 | 32.905 |
| 165 | 34.317 | 61.379 | 64.843 | 27.603 |
| 167.5 | 70.059 | 80.997 | 60.372 | 23.018 |
| 170 | 154.281 | 51.474 | 55.456 | 18.969 |
| 172.5 | 121.49 | −65.877 | 50.001 | 15.169 |
| 175 | 48.713 | −57.597 | 43.471 | 11.4 |
| 177.5 | 24.897 | −26.947 | 34.695 | 8.121 |
| 180 | 20.964 | 5.867 | 22.773 | 7.82 |
| 182.5 | 38.432 | 55.472 | 10.87 | 14.125 |
| 185 | 226.149 | 122.65 | 5.012 | 24.554 |
| 187.5 | 99.35 | −184.659 | 4.555 | 33.047 |
| 190 | 23.495 | −110.635 | 5.66 | 38.408 |
| 192.5 | 10.529 | −79.452 | 6.605 | 41.862 |
| 195 | 6.163 | −63.03 | 7.099 | 44.388 |
| 197.5 | 4.144 | −52.754 | 7.228 | 46.48 |
| 200 | 3.032 | −45.582 | 7.118 | 48.367 |

Matching circuit 100 preferably includes at least one branch having at least a capacitor and inductor there along. In the embodiment of the invention illustrated in FIG. 2A, matching circuit 100 includes, by way of example, branch 204 having L12 and C11 positioned therealong, shunt branch 208 having L14 and C12 positioned therealong and shunt branch 210 having L15 and C13 positioned therealong. In this respect, matching circuit 100 is further distinguished over conventional matching circuits which typically do not include more than one reactive element along a single branch thereof.

In particular, the inclusion of at least a capacitor and inductor along at least one branch of matching circuit 100 serves to distinguish matching circuit 100 over conventional matching circuits designed using RFT. In RFT, the topology of the matching circuit is realized as an LC ladder network by specifying only a single reactive component along each branch thereof.

In operation of matching circuit 100, respective capacitor-inductor pairs L12 and C11 along branch 204, L14 and C12 along branch 208 and L15 and C13 along branch 210 each form a resonant LC circuit. At a very low frequency, below the resonant frequency of each resonant LC circuit, the reactance of each inductor tends to zero and the reactance of each capacitor tends to −∞. The inductor is therefore equivalent to a straight wire and only the capacitive portion of each capacitor-inductor pair is seen along the corresponding branch. As the frequency increases, the reactance of each capacitor decreases, becoming less negative, and the reactance of each inductor increases. The total reactance along each corresponding branch therefore decreases. At the resonant frequency of each capacitor-inductor pair, the reactance of the capacitor is equal and opposite to the reactance of the inductor, leading to a zero reactance along the corresponding branch and all current therefore passing along the branch. As the frequency increases beyond the resonant frequency, the reactance of each inductor tends to ∞ and the reactance of each capacitor tends to zero, leading to an increased total reactance along the corresponding branch.

It will be appreciated by one skilled in the art that the above-described behavior of each capacitor-inductor pair forming a resonant LC circuit resembles that of a switch, since the current directed along each branch varies with the total branch reactance, which total branch reactance varies in turn with the signal frequency. This feature of a preferred embodiment of the matching circuit of the present invention creates significant advantages in operation of the matching circuit of the present invention.

Firstly, the switch-like behavior of second parallel resonant LC branch 204 controls current distribution between first parallel branch 202 and second parallel branch 204 in accordance with the relative reactances of first parallel branch 202 and second parallel branch 204, without the use of switches.

Hence, in the case that the signal source is operative to generate a radio-frequency signal over a predetermined frequency range, which predetermined frequency range includes a plurality of frequency sub-ranges, parallel branches 202 and 204 preferably co-operate so as to match the antenna to the signal source over at least one frequency sub-range of the plurality of frequency sub-ranges. Matching circuit 100 is thus preferably capable of operating as a broadband matching circuit over a wide predetermined frequency range without the need for switches between its individual parallel branches 202 and 204, due to the inherent switch-like behavior of resonant LC branch 204.

Secondly, the switch-like behavior of parallel resonant LC branch 204 and resonant LC shunt branches 208 and 210 serve to widen the bandwidth of matching circuit 100 for a given gain, in comparison to conventional matching circuits. Alternatively stated, the switch-like behavior of resonant LC shunt branches 208 and 210 serves to increase the gain of matching circuit 100 for a given bandwidth, in comparison to conventional matching circuits.

This improvement in performance of matching circuit 100 may be attributed to the switch-like behavior of resonant LC branches 204, 208 and 210 creating regions in the frequency domain over which the reactance of each of branches 204, 208 and 210 is changing and therefore matching may occur. In this respect, resonant LC branches 204, 208 and 210 of matching circuit 100 act as filters, which filters carry out matching over the frequency region in which they change from a fully non-conductive to fully-conductive state.

The improved performance of matching circuit 100 may be best appreciated with reference to the graphs shown in FIGS. 2B and 2C. FIG. 2B is a graph showing the voltage gain of the antenna through the matching circuit 100 and FIG. 2C is a graph showing the return loss of the antenna through the matching circuit 100. As seen in FIG. 2B, matching circuit 100 exhibits filter-like behavior over the 100-200 MHz band, and produces voltage gains of greater than 0.7 over the 140-170 MHz range. As seen in FIG. 2C, matching circuit 100 produces low return losses when used in an antenna system.

The wideband performance of matching circuit 100 is particularly advantageous in comparison to the performance of conventional matching circuits designed using RFT. Matching circuits designed using RFT have a flat gain, in comparison to the varying gain of matching circuit 100 seen in FIG. 2B, which flat gain is lower and spans a narrower bandwidth that the gain and bandwidth produced by matching circuit 100.

It is a particular feature of matching circuit 100 that inductor L14 is included in matching circuit 100, although it does not significantly contribute to the matching behavior of matching circuit 100 over the 100-200 MHz range, in order to adapt matching circuit 100 for possible further use in additional high frequency bands beyond 200 MHz. In the absence of inductor L14, capacitor C12 along branch 208 would provide a low reactance current path to the ground at higher frequency bands of operation, thereby preventing current reaching the antenna. Matching circuit 100 is thus adapted for possible operation as a multi-band matching circuit in addition to as a broadband matching circuit.

It is appreciated that in operation at higher frequency bands an additional capacitor positioned along branch 202, forming an LC circuit with inductor L11, would also be required, since otherwise the high inductive reactance of inductor L11 would prevent current reaching the antenna. The presence of this additional capacitor is not illustrated in FIG. 2A, since its capacitance value is preferably determined in accordance with the impedance to be matched at higher frequency bands.

Figure 3A:
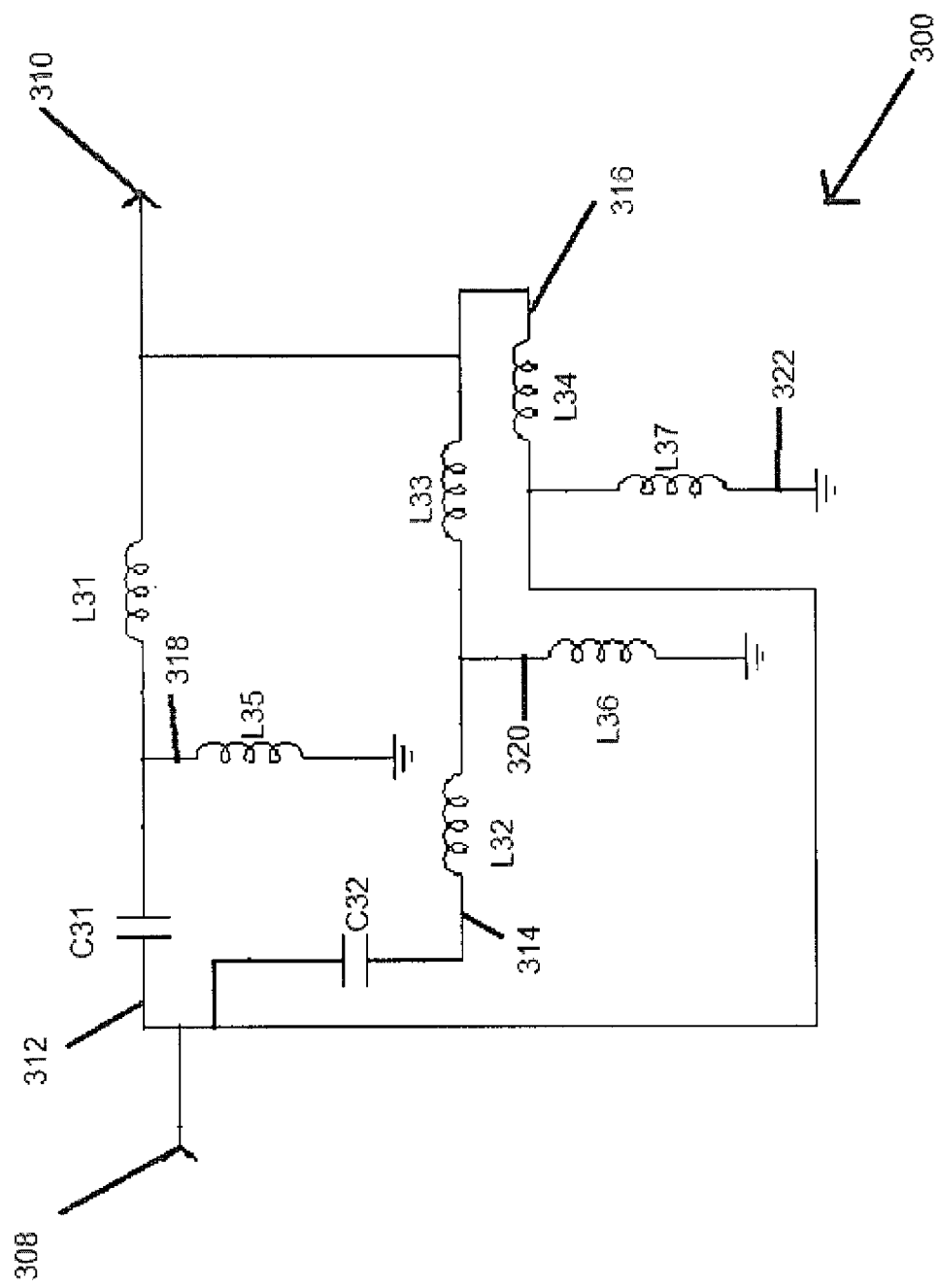
FIG. 3A is a schematic circuit diagram of a matching circuit constructed and operative in accordance with another preferred embodiment of the present invention.
Figure 3B:
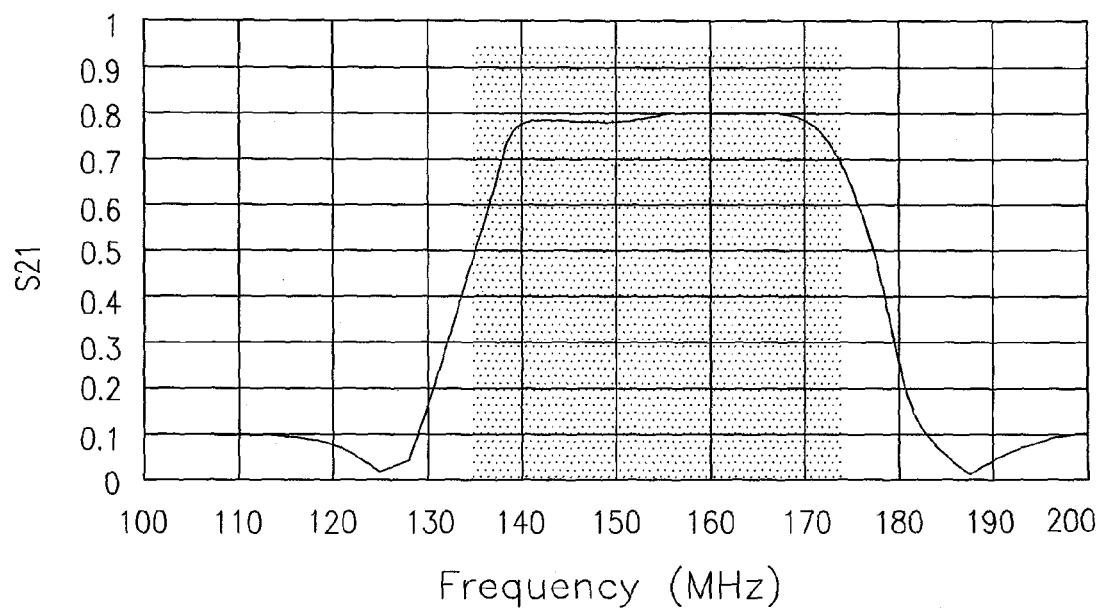
FIGS. 3B and 3C are simplified graphs showing performances of a matching circuit of the type shown in FIG. 3A.
Figure 3C:
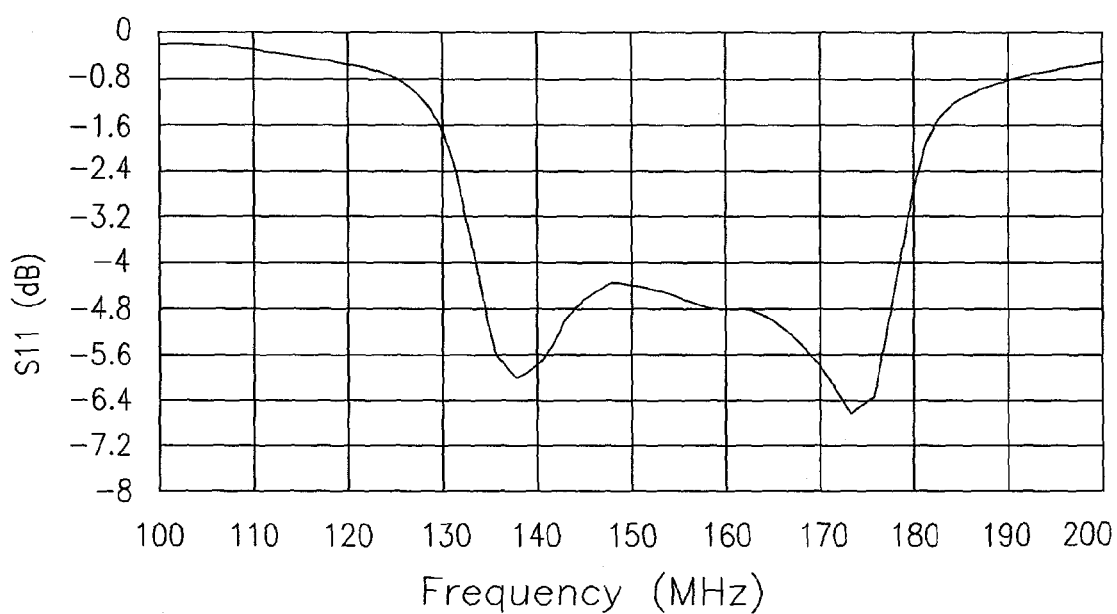

Reference is now made to FIG. 3A which is a schematic circuit diagram of a matching circuit constructed and operative in accordance with another preferred embodiment of the present invention, and to FIGS. 3B and 3C, which are simplified graphs showing performances of a matching circuit of the type shown in FIG. 3A.

As seen in FIG. 3A, there is provided a matching circuit 300, preferably connected to a first, input port 308 and to a second, output port 310. Matching circuit 300 preferably receives an input signal at first port 308 from a signal source (not shown) operative to provide a radio-frequency (RF) signal over a predetermined frequency range. Matching circuit 300 preferably delivers an output signal to second port 310, which output signal is preferably delivered to an antenna (not shown). Matching circuit 300 is preferably operative to match the impedance of the antenna to the impedance of the signal source over the predetermined frequency range of the signal source, in order to maximize the energy transfer between the signal source and the antenna.

Matching circuit 300 preferably includes a first capacitor C31 and a first inductor L31 preferably positioned along a first parallel branch 312 thereof, a second capacitor C32, a second inductor L32 and a third inductor L33 preferably positioned along a second parallel branch 314 thereof and a fourth inductor L34 preferably positioned along a third parallel branch 316 thereof. Matching circuit 300 further preferably includes a fifth inductor L35 preferably positioned along a first shunt branch 318, a sixth inductor L36 preferably positioned along a second shunt branch 320 and a seventh inductor L37 preferably positioned along a third shunt branch 322.

Inductors L31-L37 preferably comprise coils. The respective inductance and capacitance values of inductors L31-L37 and capacitors C31 and C32 are preferably selected in accordance with the impedance values of the source and antenna to which the source is matched. By way of example, L31 preferably has an inductance of approximately 448.6 nH, L32 an inductance of approximately 63.4 nH, L33 an inductance of approximately 50.0 nH, L34 an inductance of approximately 75.4 nH, L35 an inductance of approximately 89.5 nH, L36 an inductance of approximately 102.9 nH and L37 an inductance of approximately 104.8 nH. Further by way of example, C31 preferably has a capacitance of approximately 8.8 pF and C32 a capacitance of approximately 10.8 pF.

Matching circuit 300 may be adapted to match an antenna having a reactance of approximately zero and a resistance of approximately 16 Ohms at a frequency of approximately 168 MHz. It is understood, however, that matching circuit 300 may be modified by one skilled in the art so as to match antennas having a variety of impedances. It is further understood that the above-listed component values of inductors L31-L37 and capacitors C31 and C32 are exemplary only and may be readily scaled according to the frequency range over which matching circuit 300 preferably operates.

As is readily appreciated from consideration of the topology of matching circuit 300, matching circuit 300 preferably comprises a multiple branch matching circuit, which multiple branches here include, by way of example, first branch 312, second branch 314 parallel to the first branch 312 and third branch 316 parallel to first and second branches 312 and 314. Due to the presence of first, second and third parallel branches 312, 314 and 316, matching circuit 300 preferably provides multiple current paths between first port 308 and second port 310, and thus between the signal source and the antenna.

The provision by matching circuit 300 of multiple current paths between the signal source and the antenna is a highly advantageous feature of a preferred embodiment of the present invention. This is because the Hilbert transform, which is a function relating the real and the imaginary parts of the impedance of conventional matching circuits, fails in the case of a multiple current path matching circuit. As a result of the inclusion of multiple current paths in matching circuit 300, the real and imaginary parts of the impedance of matching circuit 300 are no longer defined by the Hilbert transform and thus may be more freely selected and optimized.

The provision of multiple current paths by matching circuit 300 is in contrast to conventional matching circuits designed using RFT, which conventional matching circuits typically provide only a single current path having only a single reactive component positioned therealong between the signal source and the antenna. Matching circuits designed using RFT are therefore constrained to have impedances whose real and imaginary parts are defined by the Hilbert transform.

Measured values for the real and imaginary parts of the impedance of matching circuit 300 as seen at the first port 308 and the second port 310 over a frequency range of 100-200 MHz are shown in Table 2. As may be calculated by one skilled in the art based on the values displayed in Table 2, the real and imaginary parts of the impedance of matching circuit 300 as seen at first and second ports 308 and 310 are not related by the Hilbert transform.

TABLE 2

| Frequency (MHz) | Real part of impedance (port 1, Ω) | Imaginary part of impedance (port 1, Ω) | Real part of impedance (port 2, Ω) | Imaginary part of impedance (port 1, Ω) |
|---|---|---|---|---|
| 100 | 2.342 | 84.06 | 5.712 | 43.882 |
| 102.5 | 2.983 | 93.466 | 5.338 | 45.369 |
| 105 | 3.955 | 105.536 | 4.849 | 47.063 |
| 107.5 | 5.468 | 122.134 | 4.241 | 49.044 |
| 110 | 8.53 | 146.658 | 3.527 | 51.424 |
| 112.5 | 15.462 | 187.461 | 2.754 | 54.36 |
| 115 | 37.264 | 271.453 | 2.047 | 58.059 |

TABLE 2-continued

| Frequency (MHz) | Real part of impedance (port 1, Ω) | Imaginary part of impedance (port 1, Ω) | Real part of impedance (port 2, Ω) | Imaginary part of impedance (port 1, Ω) |
|---|---|---|---|---|
| 117.5 | 196.399 | 537.141 | 1.668 | 62.772 |
| 120 | 612.57 | −628.386 | 2.123 | 68.718 |
| 122.5 | 65.089 | −219.516 | 4.253 | 75.889 |
| 125 | 25.888 | −97.411 | 9.148 | 83.637 |
| 127.5 | 17.465 | −41.071 | 17.515 | 90.308 |
| 130 | 16.674 | −4.102 | 28.608 | 93.696 |
| 132.5 | 20.354 | 25.837 | 40.053 | 92.671 |
| 135 | 30.382 | 59.206 | 49.495 | 88.159 |
| 137.5 | 62.99 | 100.82 | 56.089 | 82.078 |
| 140 | 161.36 | 124.876 | 60.277 | 75.905 |
| 142.5 | 269.233 | −10.185 | 62.88 | 70.293 |
| 145 | 147.981 | −135.928 | 64.585 | 65.351 |
| 147.5 | 66.029 | −109.048 | 65.837 | 60.945 |
| 150 | 36.924 | −78.435 | 66.881 | 56.868 |
| 152.5 | 24.736 | −57.046 | 67.826 | 52.908 |
| 155 | 18.58 | −41.522 | 68.687 | 48.867 |
| 157.5 | 15.217 | −29.583 | 69.403 | 44.571 |
| 160 | 13.406 | −19.617 | 69.841 | 39.873 |
| 162.5 | 12.123 | −10.836 | 69.792 | 34.671 |
| 165 | 11.941 | −2.176 | 68.971 | 28.94 |
| 167.5 | 12.856 | 6.674 | 67.028 | 22.786 |
| 170 | 15.006 | 16.614 | 63.61 | 16.504 |
| 172.5 | 19.982 | 28.892 | 58.465 | 10.61 |
| 175 | 31.827 | 46.311 | 51.597 | 5.801 |
| 177.5 | 69.465 | 73.196 | 43.392 | 2.782 |
| 180 | 193.185 | 4.502 | 34.589 | 2.014 |
| 182.5 | 67.048 | −102.377 | 26.078 | 3.532 |
| 185 | 19.681 | −64.174 | 18.613 | 6.945 |
| 187.5 | 8.829 | −42.001 | 12.622 | 11.622 |
| 190 | 5.09 | −28.937 | 8.195 | 16.924 |
| 192.5 | 3.446 | −20.229 | 5.181 | 22.341 |
| 195 | 2.586 | −13.835 | 3.325 | 27.545 |
| 197.5 | 2.084 | −8.827 | 2.351 | 32.359 |
| 200 | 1.765 | −4.711 | 2.019 | 36.713 |

Matching circuit 300 preferably includes at least one branch having at least a capacitor and inductor there along. In the embodiment of the invention illustrated in FIG. 3A, matching circuit 300 includes, by way of example, first parallel branch 312 having C31 and L31 positioned therealong and second parallel branch 314 having C32, L32 and L33 positioned therealong. In this respect, matching circuit 300 is further distinguished over conventional matching circuits which typically do not include more than one reactive element along a single branch thereof.

In particular, the inclusion of at least a capacitor and inductor along at least one branch of matching circuit 300 serves to distinguish matching circuit 300 over conventional matching circuits designed using RFT. In RFT, the topology of the matching circuit is realized as an LC ladder network by specifying only a single reactive component along each branch thereof.

In operation of matching circuit 300, respective capacitor-inductor pairs C31 and L31 along first parallel branch 312 and C32 and L32 along second parallel branch 314 each form a resonant LC circuit. At a very low frequency, below the resonant frequency of each resonant LC circuit, the reactance of each inductor tends to zero and the reactance of each capacitor tends to −∞. The inductor is therefore equivalent to a straight wire and only the capacitive portion of each capacitor-inductor pair is seen along the corresponding branch. As the frequency increases, the reactance of each capacitor decreases, becoming less negative, and the reactance of each inductor increases. The total reactance along each corresponding branch therefore decreases. At the resonant frequency of each capacitor-inductor pair, the reactance of the capacitor is equal and opposite to the reactance of the inductor, leading to a zero reactance along the corresponding branch and all current therefore passing along the branch. As the frequency increases beyond the resonant frequency, the reactance of each inductor tends to ∞ and the reactance of each capacitor tends to zero, leading to an increased total reactance along the corresponding branch.

It will be appreciated by one skilled in the art that the above-described behavior of each capacitor-inductor pair forming a resonant LC circuit resembles that of a switch, since the current directed along each corresponding branch varies with the total branch reactance, which total branch reactance varies in turn with the signal frequency. This feature of a preferred embodiment of the matching circuit of the present invention creates significant advantages in operation of the matching circuit of the present invention.

Firstly, the switch-like behavior of first and second parallel resonant LC branches 312 and 314 serves to control current distribution between first parallel branch 312, second parallel branch 314 and third parallel branch 316 in accordance with the relative respective reactances of first, second and third parallel branches 312, 314 and 316, without the use of switches.

Hence, in the case that the signal source is operative to generate a radio-frequency signal over a predetermined frequency range, which predetermined frequency range includes a plurality of frequency sub-ranges, parallel branches 312, 314 and 316 preferably co-operate so as to match the antenna to the signal source over one frequency sub-range of the plurality of frequency sub-ranges. Matching circuit 300 is thus preferably capable of operating as a broadband matching circuit over a wide predetermined frequency range without the need for switches between its individual parallel branches 312, 314 and 316, due to the inherent switch-like behavior of resonant LC branches 312 and 314.

Secondly, the switch-like behavior of resonant LC branches 312 and 314 serves to widen the bandwidth of matching circuit 300 for a given gain, in comparison to conventional matching circuits. Alternatively stated, the switch-like behavior of resonant LC branches 312 and 314 serves to increase the gain of matching circuit 300 for a given bandwidth, in comparison to conventional matching circuits.

This improvement in performance of matching circuit 300 may be attributed to the switch-like behavior of resonant LC branches 312 and 314 creating regions in the frequency domain over which the reactance of each of branches 312 and 314 is changing and therefore matching may occur. In this respect, resonant LC branches 312 and 314 of matching circuit 300 act as filters, which filters carry out matching over the frequency region in which they change from a fully non-conductive to fully-conductive state.

The improved performance of matching circuit 300 may be best appreciated with reference to the graphs shown in FIGS. 3B and 3C. FIG. 3B is a graph showing the voltage gain of the antenna through the matching circuit 300 and FIG. 3C is a graph showing the return loss of the antenna through the matching circuit 300. As seen in FIG. 3B, matching circuit 300 exhibits filter-like behavior over the 100-200 MHz band, and produces voltage gains of greater than 0.7 over the 140-170 MHz range. As seen in FIG. 3C, matching circuit 300 produces low return losses when used in an antenna system.

The wideband performance of matching circuit 300 is particularly advantageous in comparison to the performance of conventional matching circuits designed using RFT. Matching circuits designed using RFT have a flat gain, in comparison to the varying gain of matching circuit 300 seen in FIG. 3B, which flat gain is lower and spans a narrower bandwidth that the gain and bandwidth produced by matching circuit 300.

Figure 4A:
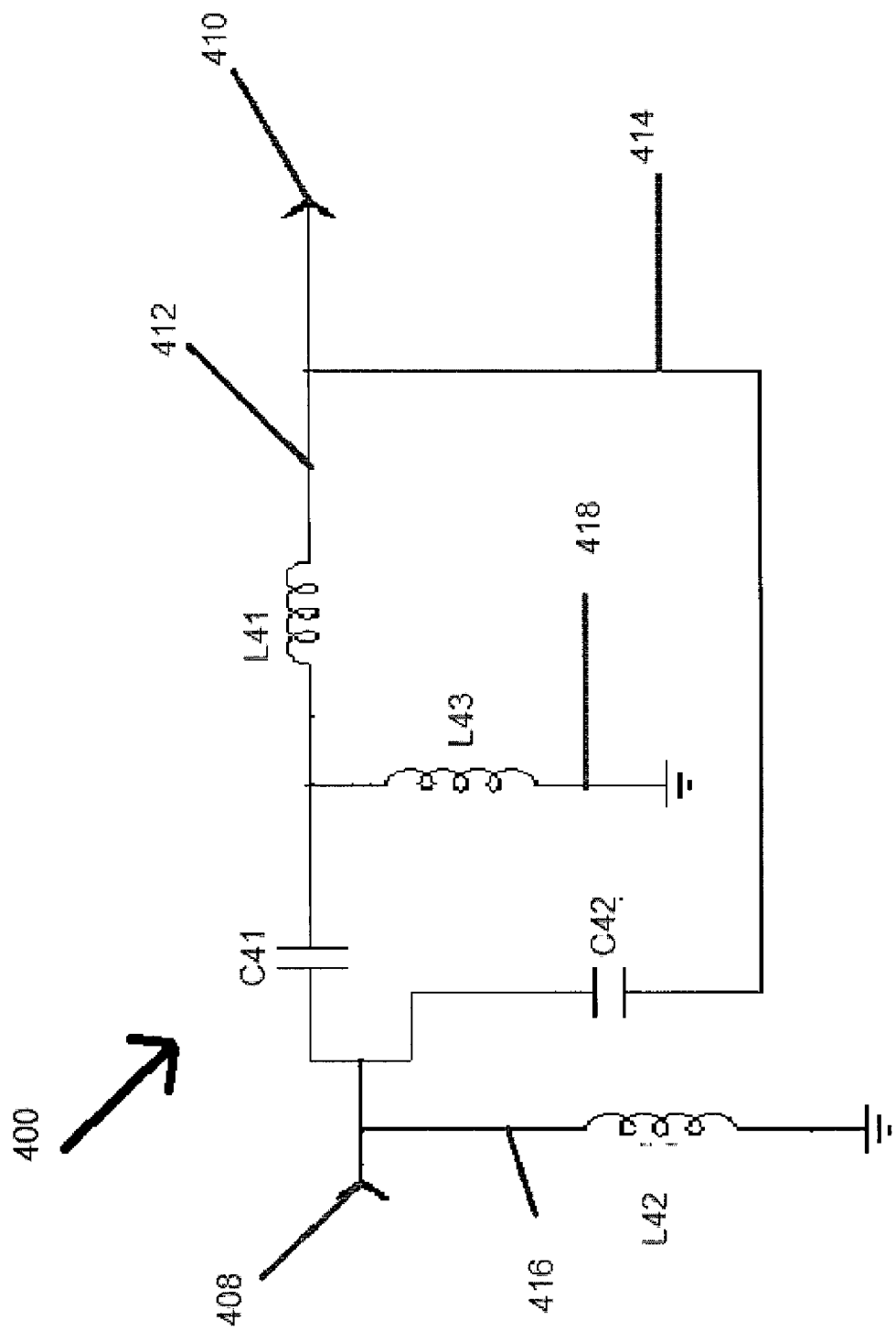
FIG. 4A is a schematic circuit diagram of a matching circuit constructed and operative in accordance with a further preferred embodiment of the present invention.
Figure 4B:
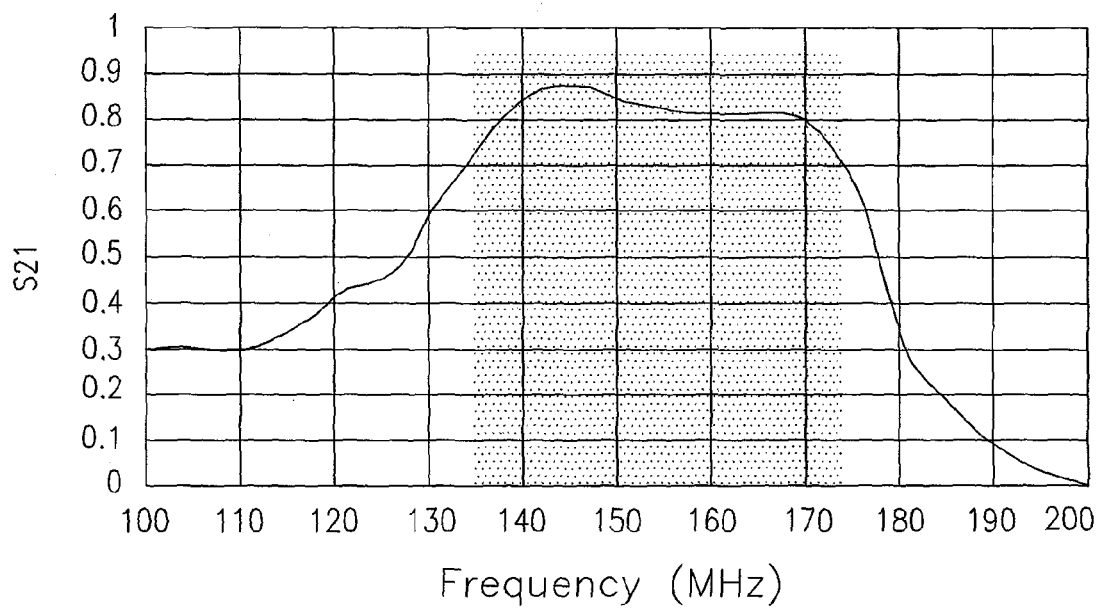
FIGS. 4B and 4C are simplified graphs showing performances of a matching circuit of the type shown in FIG. 4A.
Figure 4C:
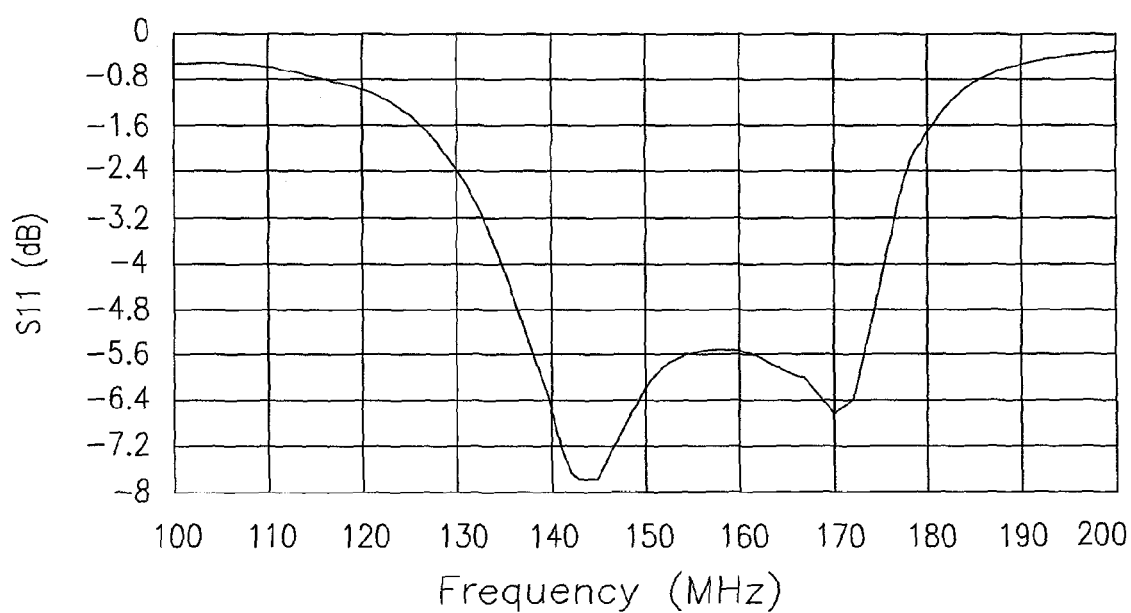

Reference is now made to FIG. 4A which is a schematic circuit diagram of a matching circuit constructed and operative in accordance with a further preferred embodiment of the present invention, and to FIGS. 4B and 4C, which are simplified graphs showing performances of a matching circuit of the type shown in FIG. 4A.

As seen in FIG. 4A, there is provided a matching circuit 400, preferably connected to a first, input port 408 and to a second, output port 410. Matching circuit 400 preferably receives an input signal at first port 408 from a signal source (not shown) operative to provide a radio-frequency (RF) signal over a predetermined frequency range. Matching circuit 400 preferably delivers an output signal to second port 410, which output signal is preferably delivered to an antenna (not shown). Matching circuit 400 is preferably operative to match the impedance of the antenna to the impedance of the signal source over the predetermined frequency range of the signal source, in order to maximize the energy transfer between the signal source and the antenna.

Matching circuit 400 preferably includes a first capacitor C41 and a first inductor L41 preferably positioned along a first parallel branch 412 thereof and a second capacitor C42 preferably positioned along a second parallel branch 414 thereof. Matching circuit 400 further preferably includes a second inductor L42 preferably positioned along a first shunt branch 416 and a third inductor L43 preferably positioned along a second shunt branch 418.

Inductors L41-L43 preferably comprise coils. The respective inductance and capacitance values of inductors L41-L43 and capacitors C41 and C42 are preferably selected in accordance with the impedance values of the source and antenna to which the source is matched. By way of example, L41 preferably has an inductance of approximately 400.3 nH, L42 an inductance of approximately 46.2 nH and L43 an inductance of approximately 78.1 nH. Further by way of example, C41 preferably has a capacitance of approximately 11.6 pF and C42 a capacitance of approximately 7.0 pF.

Matching circuit 400 may be adapted to match an antenna having a reactance of approximately zero and a resistance of approximately 33 Ohms at a frequency of approximately 145 MHz. It is understood, however, that matching circuit 400 may be modified by one skilled in the art so as to match antennas having a variety of impedances. It is further understood that the above-listed component values of inductors L41-L43 and capacitors C41 and C42 are exemplary only and may be readily scaled according to the frequency range over which matching circuit 400 preferably operates.

As is readily appreciated from consideration of the topology of matching circuit 400, matching circuit 400 preferably comprises a multiple branch matching circuit, which multiple branches here include, by way of example, first branch 412 and second branch 414 parallel to the first branch 412. Due to the presence of first and second parallel branches 412 and 414, matching circuit 400 preferably provides multiple current paths between first port 408 and second port 410, and thus between the signal source and the antenna.

The provision by matching circuit 400 of multiple current paths between the signal source and the antenna is a highly advantageous feature of a preferred embodiment of the present invention. This is because the Hilbert transform, which is a function relating the real and the imaginary parts of the impedance of conventional matching circuits, fails in the case of a multiple current path matching circuit. As a result of the inclusion of multiple current paths in matching circuit 400, the real and imaginary parts of the impedance of matching circuit 400 are no longer defined by the Hilbert transform and thus may be more freely selected and optimized.

The provision of multiple current paths by matching circuit 400 is in contrast to conventional matching circuits designed using RFT, which conventional matching circuits typically provide only a single current path having only a single reactive component positioned therealong between the signal source and the antenna. Matching circuits designed using RFT are therefore constrained to have impedances whose real and imaginary parts are defined by the Hilbert transform.

Measured values for the real and imaginary parts of the impedance of matching circuit 400 as seen at the first port 408 and the second port 410 over a frequency range of 100-200 MHz are shown in Table 3. As may be calculated by one skilled in the art based on the values displayed in Table 3, the real and imaginary parts of the impedance of matching circuit 400 as seen at first and second ports 408 and 410 are not related by the Hilbert transform.

TABLE 3

| Frequency (MHz) | Real part of impedance (port 1, Ω) | Imaginary part of impedance (port 1, Ω) | Real part of impedance (port 2, Ω) | Imaginary part of impedance (port 1, Ω) |
| --- | --- | --- | --- | --- |
| 100 | 2.321 | 35.472 | 164.417 | −369.029 |
| 102.5 | 2.467 | 37.396 | 149.657 | −329.489 |
| 105 | 2.497 | 39.755 | 139.094 | −296.721 |
| 107.5 | 2.752 | 42.544 | 131.51 | −269.055 |
| 110 | 2.945 | 45.653 | 126.137 | −245.319 |
| 112.5 | 3.455 | 49.416 | 122.479 | −224.667 |
| 115 | 4.157 | 53.951 | 120.205 | −206.482 |
| 117.5 | 5.732 | 59.565 | 119.097 | −190.298 |
| 120 | 8.361 | 65.688 | 119.015 | −175.764 |
| 122.5 | 10.918 | 73.534 | 119.874 | −162.61 |
| 125 | 15.872 | 85.594 | 121.633 | −150.633 |
| 127.5 | 27.252 | 102.338 | 124.288 | −139.681 |
| 130 | 53.095 | 123.722 | 127.867 | −129.646 |
| 132.5 | 113.569 | 138.146 | 132.431 | −120.467 |
| 135 | 196.537 | 65.102 | 138.071 | −112.124 |
| 137.5 | 166.681 | −41.831 | 144.912 | −104.656 |
| 140 | 86.386 | −60.821 | 153.113 | −98.165 |
| 142.5 | 53.573 | −48.077 | 162.863 | −92.848 |
| 145 | 34.983 | −33.196 | 174.376 | −89.029 |
| 147.5 | 24.752 | −21.976 | 187.857 | −87.214 |
| 150 | 18.556 | −11.34 | 203.449 | −88.162 |
| 152.5 | 16.166 | −1.948 | 221.098 | −92.963 |
| 155 | 15.766 | 5.325 | 240.315 | −103.097 |
| 157.5 | 16.453 | 11.532 | 259.773 | −120.345 |
| 160 | 17.434 | 17.539 | 276.783 | −146.356 |
| 162.5 | 20.019 | 25.025 | 286.973 | −181.562 |
| 165 | 25.53 | 34.699 | 284.986 | −223.53 |
| 167.5 | 41.571 | 46.767 | 266.973 | −265.942 |
| 170 | 90.812 | 49.236 | 233.824 | −300.337 |
| 172.5 | 100.836 | −50.638 | 191.76 | −320.495 |
| 175 | 29.418 | −52.884 | 148.865 | −325.51 |
| 177.5 | 10.773 | −32.023 | 111.037 | −318.782 |
| 180 | 5.721 | −19.228 | 80.683 | −304.997 |
| 182.5 | 3.432 | −11.074 | 57.706 | −288.019 |
| 185 | 2.486 | −5.36 | 40.903 | −270.331 |
| 187.5 | 1.879 | −1.071 | 28.861 | −253.275 |
| 190 | 1.462 | 2.425 | 20.341 | −237.462 |
| 192.5 | 1.226 | 5.284 | 14.376 | −223.091 |
| 195 | 1.058 | 7.744 | 10.249 | −210.152 |
| 197.5 | 0.948 | 9.9 | 7.444 | −198.541 |
| 200 | 0.866 | 11.83 | 5.592 | −188.122 |

Matching circuit 400 preferably includes at least one branch having at least a capacitor and inductor there along. In the embodiment of the invention illustrated in FIG. 4A, matching circuit 400 includes, by way of example, first parallel branch 412 having C41 and L41 positioned therealong. In this respect, matching circuit 400 is further distinguished over conventional matching circuits which typically do not include more than one reactive element along a single branch thereof.

In particular, the inclusion of at least a capacitor and inductor along at least one branch of matching circuit 400 serves to distinguish matching circuit 400 over conventional matching circuits designed using RFT. In RFT, the topology of the matching circuit is realized as an LC ladder network by specifying only a single reactive component along each branch thereof.

In operation of matching circuit 400, capacitor-inductor pair C41 and L41 along first parallel branch 412 form a resonant LC circuit. At a very low frequency, below the resonant frequency, the reactance of inductor L41 tends to zero and the reactance of capacitor C41 tends to ∞. L41 is therefore equivalent to a straight wire and only the capacitive portion of the capacitor-inductor pair is seen along branch 412. As the frequency increases, the reactance of C41 decreases, becoming less negative, and the reactance of L41 increases. The total reactance along branch 412 thus decreases. At the resonant frequency of the capacitor-inductor pair, the capacitive reactance of C41 is equal and opposite to the inductive reactance of L41, leading to a zero reactance along branch 412 and all current therefore passing along that branch. As the frequency increases beyond the resonant frequency, the reactance of L41 tends ∞ and the reactance of C41 tends to zero, leading to an increased total reactance along branch 412.

It will be appreciated by one skilled in the art that the above-described behavior of capacitor-inductor pair C41 and L41 forming a resonant LC circuit resembles that of a switch, since the current directed along branch 412 varies with the total branch reactance, which total branch reactance varies in turn with the signal frequency. This feature of a preferred embodiment of the matching circuit of the present invention creates significant advantages in operation of the matching circuit of the present invention.

Firstly, the switch-like behavior of first parallel resonant LC branch 412 serves to control current distribution between first parallel branch 412 and second parallel branch 414 in accordance with the relative respective reactances of first and second parallel branches 412 and 414, without the use of switches.

Hence, in the case that the signal source is operative to generate a radio-frequency signal over a predetermined frequency range, which predetermined frequency range includes a plurality of frequency sub-ranges, parallel branches 412 and 414 preferably co-operate so as to match the antenna to the signal source over at least one frequency sub-range of the plurality of frequency sub-ranges. Matching circuit 400 is thus preferably capable of operating as a broadband matching circuit over a wide predetermined frequency range without the need for switches between its individual parallel branches 412 and 414, due to the inherent switch-like behavior of resonant LC branch 412.

Secondly, the switch-like behavior of resonant LC branch 412 serves to widen the bandwidth of matching circuit 400 for a given gain, in comparison to conventional matching circuits. Alternatively stated, the switch-like behavior of resonant LC branch 412 serves to increase the gain of matching circuit 400 for a given bandwidth, in comparison to conventional matching circuits.

This improvement in performance of matching circuit 400 may be attributed to the switch-like behavior of resonant LC branch 412 creating regions in the frequency domain over which the reactance of branch 412 is changing and therefore matching may occur. In this respect, resonant LC branch 412 acts as a filter, which filter carries out matching over the frequency region in which it changes from a fully non-conductive to fully-conductive state.

The improved performance of matching circuit 400 may be best appreciated with reference to the graphs shown in FIGS. 4B and 4C. FIG. 4B is a graph showing the voltage gain of the antenna through the matching circuit 400 and FIG. 4C is a graph showing the return loss of the antenna through the matching circuit 400. As seen in FIG. 4B, matching circuit 400 exhibits filter-like behavior over the 100-200 MHz band, and produces voltage gains of greater than 0.8 over the 140-170 MHz range. As seen in FIG. 4C, matching circuit 400 produces low return losses when used in an antenna system.

The wideband performance of matching circuit 400 is particularly advantageous in comparison to the performance of conventional matching circuits designed using RFT. Matching circuits designed using RFT have a flat gain, in comparison to the varying gain of matching circuit 400 seen in FIG. 4B, which flat gain is lower and spans a narrower bandwidth that the gain and bandwidth produced by matching circuit 400.

Figure 5A:
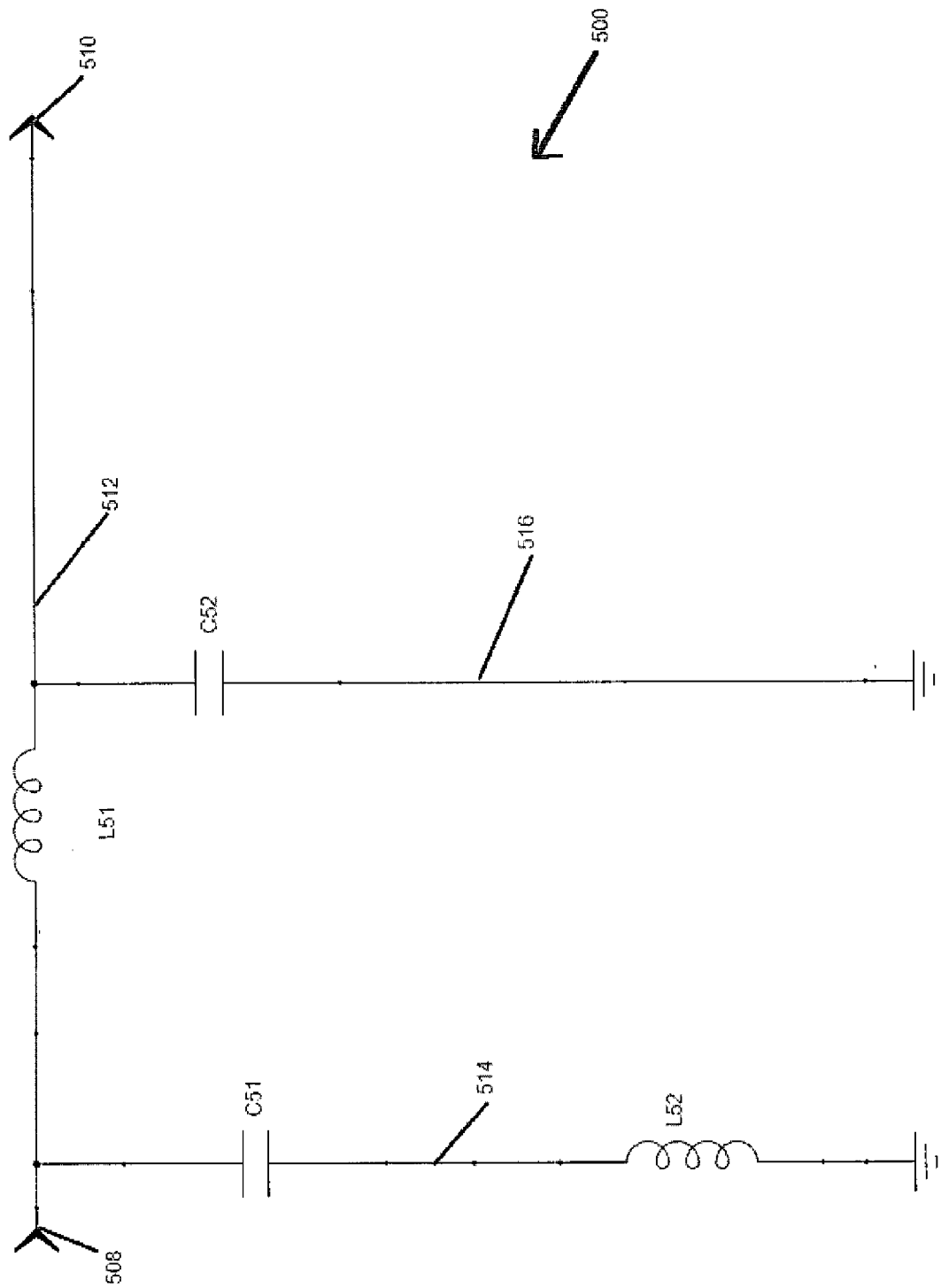
FIG. 5A is a schematic circuit diagram of a matching circuit constructed and operative in accordance with yet another preferred embodiment of the present invention.
Figure 5B:
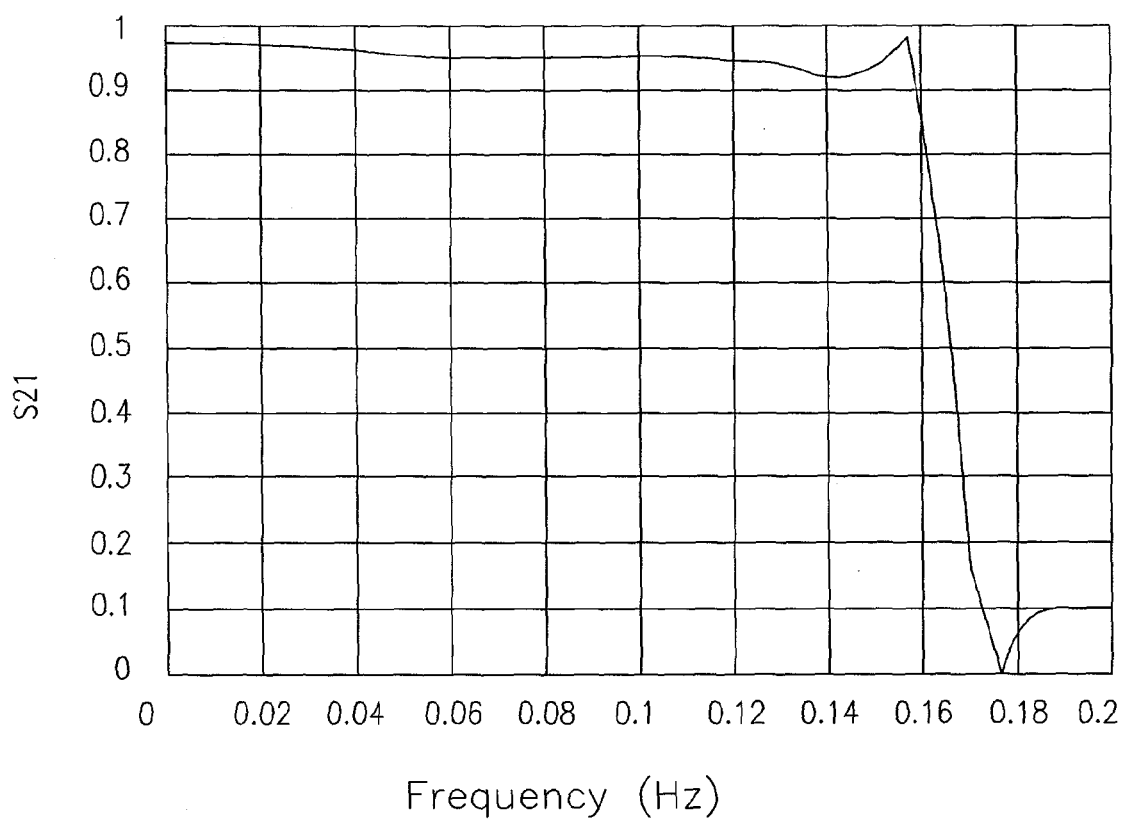
FIGS. 5B and 5C are simplified graphs showing performances of a matching circuit of the type shown in FIG. 5A.
Figure 5C:
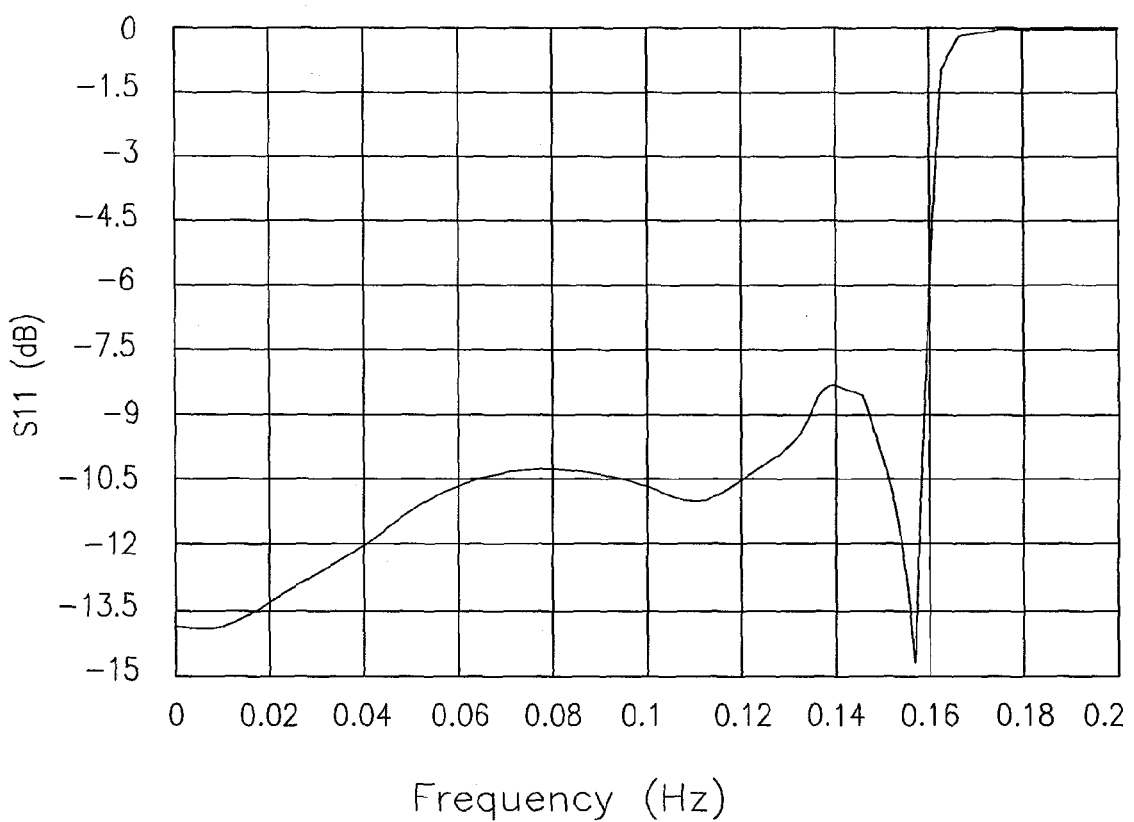

Reference is now made to FIG. 5A which is a schematic circuit diagram of a matching circuit constructed and operative in accordance with yet another preferred embodiment of the present invention, and to FIGS. 5B and 5C, which are simplified graphs showing performances of a matching circuit of the type shown in FIG. 5A.

As seen in FIG. 5A, there is provided a matching circuit 500 preferably connected to a first, input port 508 and to a second, output port 510. Matching circuit 500 preferably receives an input signal at first port 508 from a signal source (not shown) operative to provide a radio-frequency (RF) signal over a predetermined frequency range. Matching circuit 500 preferably delivers an output signal to second port 510, which output signal is preferably delivered to a load (not shown). Matching circuit 500 is preferably operative to match the impedance of the load to the impedance of the signal source over the predetermined frequency range of the signal source, in order to maximize the energy transfer between the signal source and the load.

Matching circuit 500 preferably includes a first inductor L51 preferably positioned along a first branch 512 thereof and a first capacitor C51 and a second inductor L52 preferably positioned along a first shunt branch 514 thereof. Matching circuit 500 further preferably includes a second capacitor C52 preferably positioned along a second shunt branch 516.

Inductors L51 and L52 preferably comprise coils. The respective inductance and capacitance values of inductors L51 and L52 and capacitors C51 and C52 are preferably selected in accordance with the impedance values of the source and load to which the source is matched. By way of example, L51 preferably has an inductance of approximately 2.4 H and L52 an inductance of approximately 4.1 H. Further by way of example, C51 preferably has a capacitance of approximately 0.2 F and C52 a capacitance of approximately 1.2 F.

Matching circuit 500 is preferably adapted to match a load having an impedance equivalent to that of a circuit comprising an inductor having an inductance of 2.3 H, a shunt capacitor having a capacitance of 1.2 F and a resistor having a resistance of 1Ω. It is understood, however, that matching circuit 500 may be modified by one skilled in the art so as to match loads having a variety of impedances. It is further understood that the above-listed component values of inductors L51 and L52 and capacitors C51 and C52 are exemplary only and may be readily scaled according to the frequency range over which matching circuit 500 preferably operates.

As is readily appreciated from consideration of the topology of matching circuit 500, matching circuit 500 preferably provides a single current path, preferably formed by branch 512, between first port 508 and second port 510, and thus between the signal source and the load. In this respect, matching circuit 500 preferably differs from matching circuits 100-400, which matching circuits preferably respectively provide multiple current paths between the signal source and the antenna.

Matching circuit 500 preferably includes at least one branch having at least a capacitor and inductor positioned therealong. In the embodiment of the invention illustrated in FIG. 5A, matching circuit 500 includes, by way of example, first shunt branch 514 having C51 and L52 positioned therealong. Matching circuit 500 is thus distinguished over conventional matching circuits which typically do not include more than one reactive element along a single branch thereof.

In particular, the inclusion of at least a capacitor and inductor along at least one branch of matching circuit 500 serves to distinguish matching circuit 500 over conventional matching circuits designed using RFT. In RFT, the topology of the matching circuit is realized as an LC ladder network by specifying only a single reactive component along each branch thereof.

It is a particular feature of a preferred embodiment of matching circuit 500 that, despite providing only a single current path between the signal source and the load, the real and imaginary parts of the characteristic impedance of matching circuit 500 with respect to the first and second ports 508 and 510 are not defined by the Hilbert transform.

Measured values for the real and imaginary parts of the impedance of matching circuit 500 as seen at the first port 508 and the second port 510 over a frequency range of 0-0.2 Hz are shown in Table 4. As may be calculated by one skilled in the art based on the values displayed in Table 4, the real and imaginary parts of the impedance of matching circuit 500 as seen at first and second ports 508 and 510 are not related by the Hilbert transform.

TABLE 4

| Frequency (MHz) | Real part of impedance (port 1, Ω) | Imaginary part of impedance (port 1, Ω) | Real part of impedance (port 2, Ω) | Imaginary part of impedance (port 1, Ω) |
|---|---|---|---|---|
| 0 | 1 | 0 | 1.505 | 0 |
| 0.005 | 1.001 | 0.06 | 1.506 | −0.035 |
| 0.010 | 1.003 | 0.119 | 1.508 | −0.07 |
| 0.015 | 1.008 | 0.179 | 1.512 | −0.107 |
| 0.020 | 1.014 | 0.24 | 1.517 | −0.146 |
| 0.025 | 1.025 | 0.309 | 1.523 | −0.187 |
| 0.030 | 1.041 | 0.379 | 1.528 | −0.232 |
| 0.035 | 1.061 | 0.449 | 1.533 | −0.281 |
| 0.040 | 1.086 | 0.52 | 1.536 | −0.333 |
| 0.045 | 1.129 | 0.602 | 1.535 | −0.389 |
| 0.050 | 1.182 | 0.683 | 1.531 | −0.449 |
| 0.055 | 1.248 | 0.762 | 1.521 | −0.511 |
| 0.060 | 1.328 | 0.839 | 1.505 | −0.576 |
| 0.065 | 1.446 | 0.915 | 1.483 | −0.641 |
| 0.070 | 1.593 | 0.976 | 1.453 | −0.705 |
| 0.075 | 1.772 | 1.012 | 1.416 | −0.767 |
| 0.080 | 1.986 | 1.007 | 1.373 | −0.825 |
| 0.085 | 2.251 | 0.912 | 1.324 | −0.877 |
| 0.090 | 2.517 | 0.699 | 1.271 | −0.923 |
| 0.095 | 2.714 | 0.342 | 1.216 | −0.962 |
| 0.100 | 2.739 | −0.119 | 1.16 | −0.994 |

TABLE 4-continued

| Frequency (MHz) | Real part of impedance (port 1, Ω) | Imaginary part of impedance (port 1, Ω) | Real part of impedance (port 2, Ω) | Imaginary part of impedance (port 1, Ω) |
|---|---|---|---|---|
| 0.105 | 2.529 | −0.543 | 1.106 | −1.019 |
| 0.110 | 2.165 | −0.83 | 1.056 | −1.039 |
| 0.115 | 1.753 | −0.938 | 1.01 | −1.054 |
| 0.120 | 1.383 | −0.895 | 0.972 | −1.067 |
| 0.125 | 1.105 | −0.753 | 0.942 | −1.083 |
| 0.130 | 0.902 | −0.571 | 0.922 | −1.106 |
| 0.135 | 0.764 | −0.368 | 0.91 | −1.144 |
| 0.140 | 0.691 | −0.149 | 0.901 | −1.213 |
| 0.145 | 0.71 | 0.088 | 0.869 | −1.329 |
| 0.150 | 0.888 | 0.372 | 0.756 | −1.488 |
| 0.155 | 1.688 | 0.563 | 0.509 | −1.592 |
| 0.160 | 1.526 | −1.717 | 0.23 | −1.523 |
| 0.165 | 0.117 | −0.825 | 0.068 | −1.349 |
| 0.170 | 8.806e-3 | −0.293 | 0.011 | −1.187 |
| 0.175 | 15.23e-6 | −0.011 | 17.99e-6 | −1.068 |
| 0.180 | 1.399e-3 | 0.181 | 3.693e-3 | −0.982 |
| 0.185 | 3.23e-3 | 0.33 | 0.01 | −0.918 |
| 0.190 | 4.352e-3 | 0.456 | 0.017 | −0.868 |
| 0.195 | 4.814e-3 | 0.566 | 0.021 | −0.828 |
| 0.200 | 4.856e-3 | 0.666 | 0.024 | −0.793 |
| 0.180 | 1.399e-3 | 0.181 | 3.693e-3 | −0.982 |
| 0.185 | 3.23e-3 | 0.33 | 0.01 | −0.918 |
| 0.190 | 4.352e-3 | 0.456 | 0.017 | −0.868 |
| 0.195 | 4.814e-3 | 0.566 | 0.021 | −0.828 |
| 0.200 | 4.856e-3 | 0.666 | 0.024 | −0.793 |

In operation of matching circuit 500, capacitor-inductor pair C51 and L52 along first shunt branch 514 forms a resonant LC circuit. At a very low frequency, below the resonant frequency, the reactance of inductor L52 tends to zero and the reactance of capacitor C51 tends to ∞. L52 is therefore equivalent to a straight wire and only the capacitive portion of the capacitor-inductor pair is seen along branch 514. As the frequency increases, the reactance of C51 decreases, becoming less negative, and the reactance of L52 increases. The total reactance along branch 514 thus decreases. At the resonant frequency of the capacitor-inductor pair, the capacitive reactance of C51 is equal and opposite to the inductive reactance of L52, leading to a zero reactance along branch 514 and all current therefore passing along that branch. As the frequency increases beyond the resonant frequency, the reactance of L52 tends ∞ and the reactance of C51 tends to zero, leading to an increased total reactance along branch 514.

It will be appreciated by one skilled in the art that the above-described behavior of capacitor-inductor pair C51 and L52 forming a resonant LC circuit resembles that of a switch, since the current directed along branch 514 varies with the total branch reactance, which total branch reactance varies in turn with the signal frequency.

This intrinsic switch-like behavior of resonant LC branch 514 serves to widen the bandwidth of matching circuit 500 for a given gain, in comparison to conventional matching circuits. Alternatively stated, the switch-like behavior of resonant LC branch 514 serves to increase the gain of matching circuit 500 for a given bandwidth, in comparison to conventional matching circuits.

This improvement in performance of matching circuit 500 may be attributed to the switch-like behavior of resonant LC branch 514 creating regions in the frequency domain over which the reactance of branch 514 is changing and therefore matching may occur. In this respect, resonant LC branch 514 acts as a filter, which filter carries out matching over the frequency region in which it changes from a fully non-conductive to fully-conductive state.

The improved performance of matching circuit 500 may be best appreciated with reference to the graphs shown in FIGS. 5B and 5C. FIG. 5B is a graph showing the voltage gain of the load through the matching circuit 500 and FIG. 5C is a graph showing the return loss of the load through the matching circuit 500. As seen in FIG. 5B, matching circuit 500 exhibits filter-like behavior over the 0-0.2 Hz frequency band, and produces voltage gains of greater than 0.9 over the 0-0.16 Hz range. As seen in FIG. 5C, matching circuit 500 produces low return losses when used in a source-load system.

The wideband performance of matching circuit 500 is particularly advantageous in comparison to the performance of conventional matching circuits designed using RFT. The specific above-described load to be matched by matching circuit 500 was selected since its matching has been previously calculated by Fano (F. M. Fano, 'Theoretical limitations on the broadband matching or arbitrary impedances', J. Franklin Inst., vol. 249, pp. 57-83, January 1960 and pp. 139-155, February 1960) and Carlin (H. J. Carlin, 'A new approach to gain-bandwidth problems', IEEE Trans. Circuits Syst., vol. CAS-24, pp, 170-175, April 1977). Fano showed that for a load with input series L=2.3 H, shunt C=1.2 F and R=1Ω, the maximum theoretical flat power gain achievable over a bandwidth of 0≤ω≥1 is 0.924. Carlin further showed that for such a load, the maximum flat power gain achievable over a bandwidth of 0≤ω≥1 using a matching network designed by RFT is 0.837. The matching network optimized by Carlin using RFT in this case generally resembles matching circuit 500, but without the presence of second inductor L52.

In comparison, matching circuit 500 produces voltage gains of greater than 0.9 over a bandwidth of 0-0.16 Hz, as seen in FIG. 5B. It is thus appreciated that by way of a simple modification of Carlin's optimized RFT circuit, namely by way of the addition of second inductor L52 thereby forming a resonant LC circuit along branch 514, the performance of matching circuit 500 may be significantly improved in comparison to conventional optimized RFT-based matching circuits.

It is appreciated by one skilled in the art that matching circuit 500 may be readily modified to operate over a higher frequency range, such as 0-1600 MHz rather than 0-0.16 Hz. In this case, by way of example, L51 preferably has an inductance of approximately 240 pH and L52 an inductance of approximately 410 pH. Further by way of example, C51 preferably has a capacitance of approximately 20 pF and C52 a capacitance of approximately 120 pF. The performance of matching circuit 500 over a frequency range of 0-1600 MHz is generally the same as the performance of matching circuit 500 over a frequency range of 0-0.16 Hz illustrated in FIGS. 5B and 5C.

It is a particular feature of a preferred embodiment of the present invention that although the performance of single current path matching circuits of the present invention, such as matching circuit 500, is significantly improved in comparison to that of RFT matching circuits, an intermediate version of the matching circuit of the present invention may nonetheless be developed using well known RFT procedures. The intermediate matching circuit thus generated may then be modified and further optimized by way of the addition of at least one reactive element so as to create a resonant LC circuit along at least one branch. The matching circuit of the present invention thus offers improved performance in comparison to matching circuits designed using RFT, although nonetheless making use of the simplicity and efficiency of design offered by RFT.

Figure 6A:
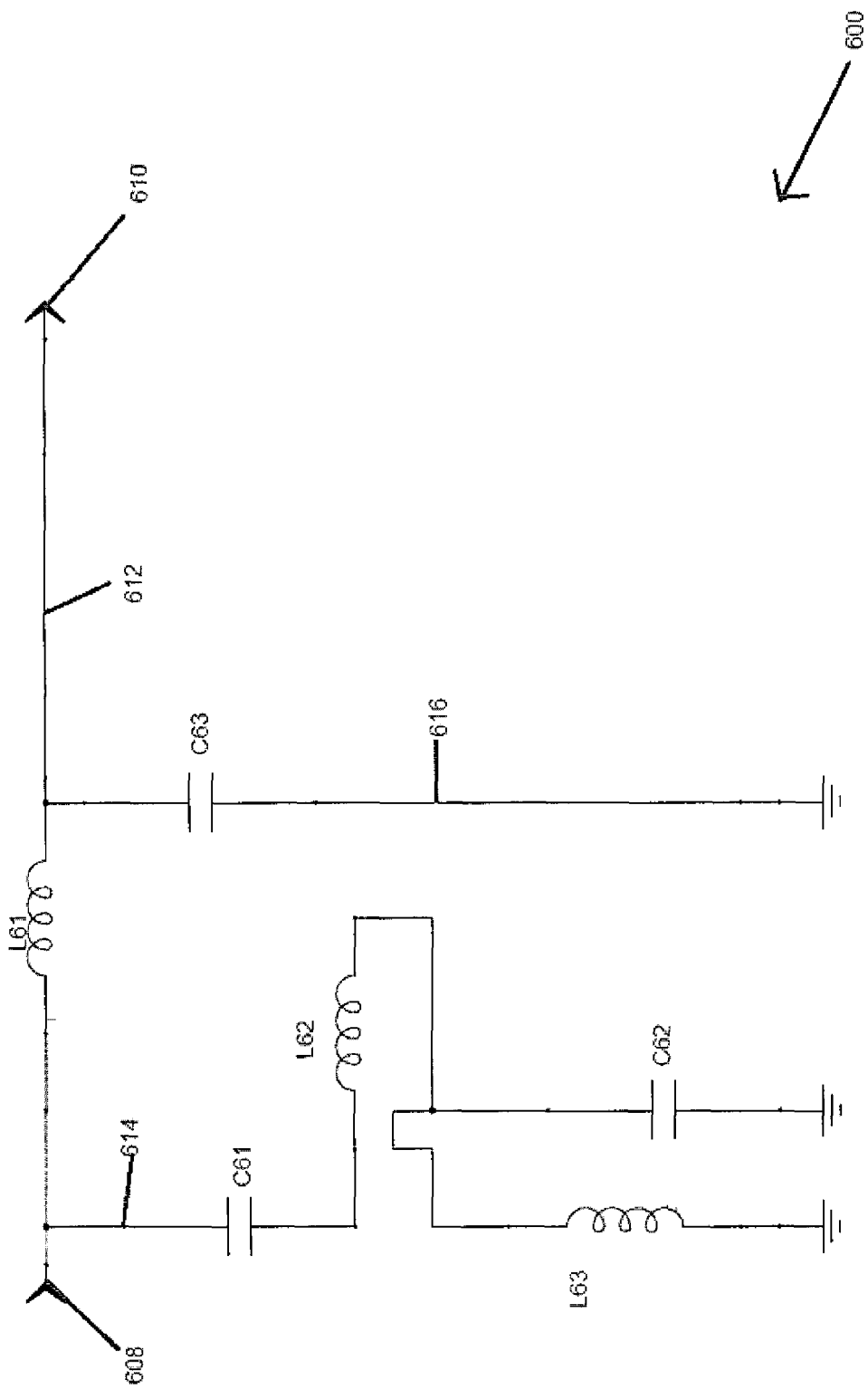
FIG. 6A is a schematic circuit diagram of a matching circuit constructed and operative in accordance with a yet further preferred embodiment of the present invention.
Figure 6B:
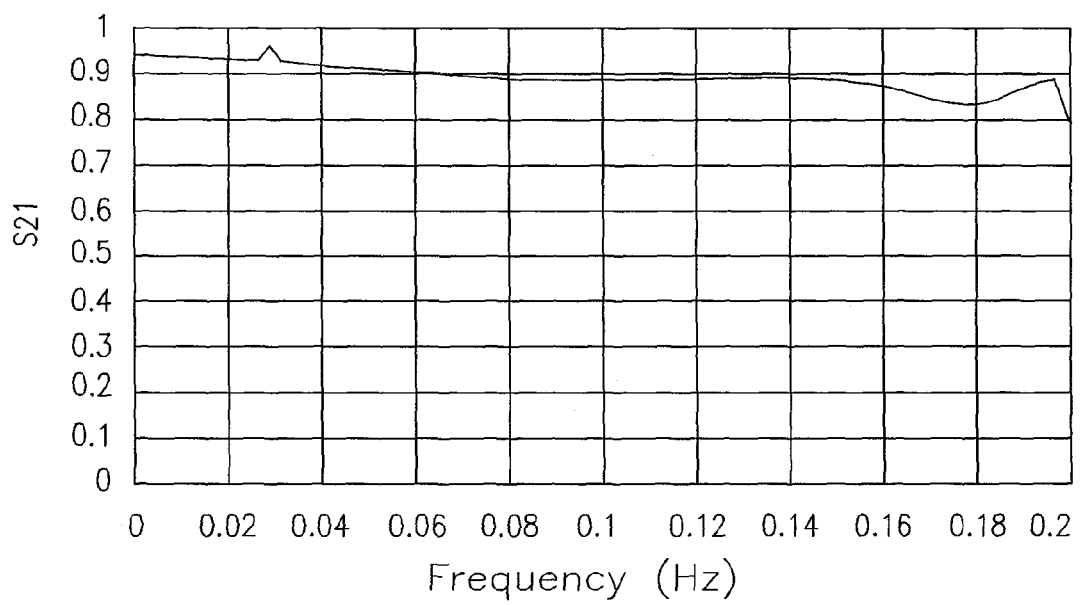
FIGS. 6B and 6C are simplified graphs showing performances of a matching circuit of the type shown in FIG. 6A.
Figure 6C:
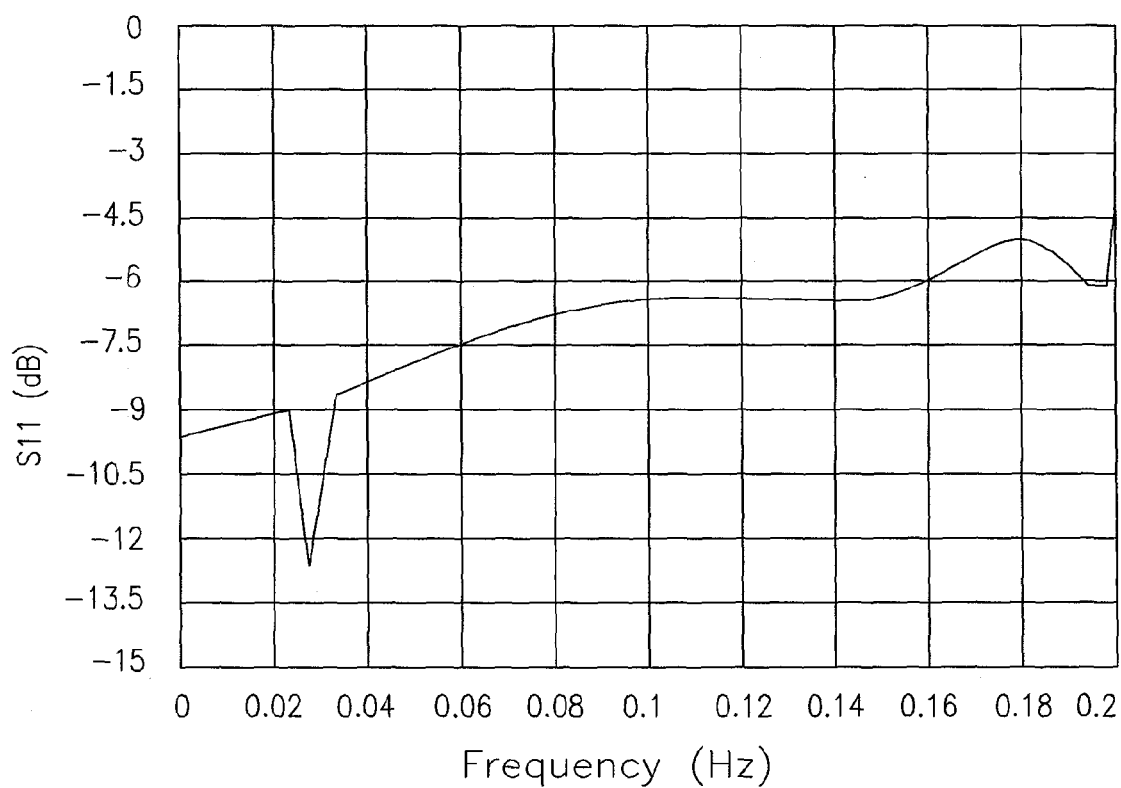

Reference is now made to FIG. 6A which is a schematic circuit diagram of a matching circuit constructed and operative in accordance with a yet further preferred embodiment of the present invention, and to FIGS. 6B and 6C, which are simplified graphs showing performances of a matching circuit of the type shown in FIG. 6A.

As seen in FIG. 6A, there is provided a matching circuit 600 preferably connected to a first, input port 608 and to a second, output port 610. Matching circuit 600 preferably receives an input signal at first port 608 from a signal source (not shown) operative to provide a radio-frequency (RF) signal over a predetermined frequency range. Matching circuit 600 preferably delivers an output signal to second port 610, which output signal is preferably delivered to a load (not shown). Matching circuit 600 is preferably operative to match the impedance of the load to the impedance of the signal source over the predetermined frequency range of the signal source, in order to maximize the energy transfer between the signal source and the load.

Matching circuit 600 preferably includes a first inductor L61 preferably positioned along a first branch 612 thereof and a first capacitor C61, a second inductor L62, a second capacitor C62 and a third inductor L63 preferably positioned along a first shunt branch 614 thereof. Matching circuit 600 further preferably includes a third capacitor C63 preferably positioned along a second shunt branch 616.

Inductors L61-L63 preferably comprise coils. The respective inductance and capacitance values of inductors L61-L63 and capacitors C61-C63 are preferably selected in accordance with the impedance values of the source and load to which the source is matched. By way of example, L61 preferably has an inductance of approximately 2.4 H, L62 an inductance of approximately 3.8 H and L63 an inductance of approximately 3.4 H. Further by way of example, C61 preferably has a capacitance of approximately 0.2 F, C62 a capacitance of approximately 9.4 F and C63 a capacitance of approximately 0.8 F.

Matching circuit 600 is preferably adapted to match a load having an impedance equivalent to that of a circuit comprising an inductor having an inductance of 2.3 H, a shunt capacitor having a capacitance of 1.2 F and a resistor having a resistance of 1Ω. It is understood, however, that matching circuit 600 may be modified by one skilled in the art so as to match loads having a variety of impedances. It is further understood that the above-listed component values of inductors L61-L63 and capacitors C61-C63 are exemplary only and may be readily scaled according to the frequency range over which matching circuit 600 preferably operates.

As is readily appreciated from consideration of the topology of matching circuit 600, matching circuit 600 preferably provides a single current path, preferably formed by branch 612, between first port 608 and second port 610, and thus between the signal source and the load. In this respect, matching circuit 600 preferably differs from matching circuits 100-400, which matching circuits preferably respectively provide multiple current paths between the signal source and the antenna.

Matching circuit 600 preferably includes at least one branch having at least a capacitor and inductor positioned therealong. In the embodiment of the invention illustrated in FIG. 6A, matching circuit 600 includes, by way of example, first shunt branch 614 having C61 and C62 and L62 and L63 positioned therealong. Matching circuit 600 is thus distinguished over conventional matching circuits which typically do not include more than one reactive element along a single branch thereof.

In particular, the inclusion of at least a capacitor and inductor along at least one branch of matching circuit 600 serves to distinguish matching circuit 600 over conventional matching circuits designed using RFT. In RFT, the topology of the matching circuit is realized as an LC ladder network by specifying only a single reactive component along each branch thereof.

It is a particular feature of a preferred embodiment of matching circuit 600 that, despite providing only a single current path between the signal source and the load, the real and imaginary parts of the characteristic impedance of matching circuit 600 with respect to the first and second ports 608 and 610 are not defined by the Hilbert transform.

Measured values for the real and imaginary parts of the impedance of matching circuit 600 as seen at the first port 608 and the second port 610 over a frequency range of 0-0.2 Hz are shown in Table 5. As may be calculated by one skilled in the art based on the values displayed in Table 5, the real and imaginary parts of the impedance of matching circuit 600 as seen at first and second ports 608 and 610 are not related by the Hilbert transform.

TABLE 5

| Frequency (MHz) | Real part of impedance (port 1, Ω) | Imaginary part of impedance (port 1, Ω) | Real part of impedance (port 2, Ω) | Imaginary part of impedance (port 1, Ω) |
|---|---|---|---|---|
| 0 | 1 | 0 | 2.019 | 0 |
| 0.004 | 1 | 0.066 | 2.019 | −0.033 |
| 0.008 | 1.001 | 0.131 | 2.02 | −0.066 |
| 0.012 | 1.003 | 0.197 | 2.022 | −0.1 |
| 0.016 | 1.005 | 0.263 | 2.024 | −0.134 |
| 0.020 | 1.008 | 0.33 | 2.027 | −0.17 |
| 0.024 | 1.014 | 0.403 | 2.029 | −0.209 |
| 0.028 | 1.241 | 0.058 | 1.108 | −0.69 |
| 0.032 | 1.027 | 0.555 | 2.042 | −0.278 |
| 0.036 | 1.037 | 0.631 | 2.043 | −0.321 |
| 0.040 | 1.049 | 0.708 | 2.045 | −0.365 |
| 0.044 | 1.069 | 0.797 | 2.046 | −0.411 |
| 0.048 | 1.092 | 0.888 | 2.046 | −0.459 |
| 0.052 | 1.12 | 0.981 | 2.044 | −0.508 |
| 0.056 | 1.152 | 1.077 | 2.04 | −0.559 |
| 0.060 | 1.19 | 1.176 | 2.033 | −0.612 |
| 0.064 | 1.244 | 1.288 | 2.023 | −0.667 |
| 0.068 | 1.308 | 1.405 | 2.01 | −0.723 |
| 0.072 | 1.385 | 1.526 | 1.994 | −0.779 |
| 0.076 | 1.477 | 1.653 | 1.973 | −0.835 |
| 0.080 | 1.587 | 1.785 | 1.949 | −0.892 |
| 0.084 | 1.739 | 1.927 | 1.92 | −0.947 |
| 0.088 | 1.927 | 2.072 | 1.888 | −1.001 |
| 0.092 | 2.164 | 2.217 | 1.851 | −1.053 |
| 0.096 | 2.463 | 2.352 | 1.811 | −1.103 |
| 0.100 | 2.84 | 2.454 | 1.768 | −1.15 |
| 0.104 | 3.298 | 2.474 | 1.722 | −1.193 |
| 0.108 | 3.855 | 2.378 | 1.674 | −1.232 |
| 0.112 | 4.49 | 2.087 | 1.624 | −1.268 |
| 0.116 | 5.121 | 1.505 | 1.573 | −1.299 |
| 0.120 | 5.545 | 0.592 | 1.522 | −1.326 |
| 0.124 | 5.507 | −0.473 | 1.471 | −1.349 |
| 0.128 | 5.02 | −1.439 | 1.421 | −1.368 |
| 0.132 | 4.232 | −2.084 | 1.372 | −1.384 |
| 0.136 | 3.375 | −2.358 | 1.326 | −1.396 |
| 0.140 | 2.624 | −2.338 | 1.282 | −1.406 |
| 0.144 | 2.06 | −2.145 | 1.241 | −1.415 |
| 0.148 | 1.627 | −1.892 | 1.204 | −1.422 |
| 0.152 | 1.299 | −1.618 | 1.171 | −1.429 |
| 0.156 | 1.05 | −1.342 | 1.142 | −1.437 |
| 0.160 | 0.869 | −1.075 | 1.118 | −1.448 |
| 0.164 | 0.751 | −0.825 | 1.097 | −1.464 |
| 0.168 | 0.664 | −0.582 | 1.081 | −1.487 |
| 0.172 | 0.602 | −0.34 | 1.067 | −1.521 |
| 0.176 | 0.566 | −0.09 | 1.05 | −1.571 |
| 0.180 | 0.562 | 0.178 | 1.024 | −1.64 |
| 0.184 | 0.613 | 0.482 | 0.976 | −1.731 |
| 0.188 | 0.756 | 0.886 | 0.885 | −1.834 |

TABLE 5-continued

| Frequency (MHz) | Real part of impedance (port 1, Ω) | Imaginary part of impedance (port 1, Ω) | Real part of impedance (port 2, Ω) | Imaginary part of impedance (port 1, Ω) |
|---|---|---|---|---|
| 0.192 | 1.178 | 1.531 | 0.735 | −1.924 |
| 0.196 | 3.185 | 2.594 | 0.537 | −1.957 |
| 0.200 | 4.343 | −4.026 | 0.335 | −1.909 |

In operation of matching circuit 600, capacitors and inductors C61, C62 and L62 and L63 along first shunt branch 614 form a resonant LC circuit structure. At a very low frequency, below the resonant frequency, the reactance of inductor L62 together with L63 and C62 tends to zero and the reactance of capacitor C61 tends to ∞. L62 together with L63 and C62 is therefore equivalent to a straight wire and only the capacitive portion C61 of the capacitor-inductor circuit is seen along branch 614. As the frequency increases, the reactance of C61 decreases, becoming less negative, and the reactance of L62 and L63 increases. The total reactance along branch 614 thus decreases. At the resonant frequency of C61 and L62 the total reactance is provided only by L63 and C62. This creates the possibility of avoiding the short circuit formed by C61 and L62. Thus, at lower frequencies the overall LC circuit along branch 614 operates in a similar manner to the LC circuit along the first shunt branch 416 of matching circuit 400, but at the resonant frequency of L63 and C62 behaves as an open circuit rather than a short circuit.

It will be appreciated by one skilled in the art that the above-described behavior of capacitor-inductor pairs C61 and L62 and L63 and C62 forming resonant LC circuits resembles that of two switches, since the current directed along branch 614 varies with the total branch reactance, which total branch reactance varies in turn with the signal frequency.

This intrinsic switch-like behavior of resonant LC branch 614 serves to widen the bandwidth of matching circuit 600 for a given gain, in comparison to conventional matching circuits. Alternatively stated, the switch-like behavior of resonant LC branch 614 serves to increase the gain of matching circuit 600 for a given bandwidth, in comparison to conventional matching circuits.

This improvement in performance of matching circuit 600 may be attributed to the switch-like behavior of resonant LC branch 614 creating regions in the frequency domain over which the reactance of branch 614 is changing and therefore matching may occur. In this respect, resonant LC branch 614 acts as a filter, which filter carries out matching over the frequency region in which it changes from a fully non-conductive to fully-conductive state.

The improved performance of matching circuit 600 may be best appreciated with reference to the graphs shown in FIGS. 6B and 6C. FIG. 6B is a graph showing the voltage gain of the load through the matching circuit 600 and FIG. 6C is a graph showing the return loss of the load through the matching circuit 600. As seen in FIG. 6B, matching circuit 600 exhibits filter-like behavior over the 0-0.2 Hz frequency band, and produces voltage gains of greater than 0.8 over the 0-0.2 Hz range. As seen in FIG. 6C, matching circuit 600 produces low return losses when used in a source-load system.

The wideband performance of matching circuit 600 is particularly advantageous in comparison to the performance of conventional matching circuits designed using RFT. The specific above-described antenna load to be matched by matching circuit 600 was selected since its matching has been previously calculated by Fano (F. M. Fano, 'Theoretical limitations on the broadband matching or arbitrary impedances', J. Franklin Inst., vol. 249, pp. 57-83, January 1960 and pp. 139-155, February 1960) and Carlin (H. J. Carlin, 'A new approach to gain-bandwidth problems', IEEE Trans. Circuits Syst., vol. CAS-24, pp. 170-175, April 1977). Fano showed that for a load with input series L=2.3 H, shunt C=1.2 F and R=1Ω, the maximum theoretical flat power gain achievable over a bandwidth of 0≤ω≥1 is 0.924. Carlin further showed that for such a load, the maximum flat power gain achievable over a bandwidth of 0≤ω≥1 using a matching network designed by RFT is 0.837. The matching network optimized by Carlin using RFT in this case generally resembles matching circuit 600, but without the presence of second and third inductors L62 and L63 and second capacitor C62.

In comparison, matching circuit 600 produces voltage gains of greater than 0.8 over a bandwidth of 0-0.2 Hz, as seen in FIG. 5B. It is thus appreciated that by way of a simple modification of Carlin's optimized RFT circuit, namely by way of the addition of second and third inductors L62 and L63 and second capacitor C62 thereby forming resonant LC circuits along branch 614, the performance of matching circuit 600 may be significantly improved in comparison to conventional optimized RFT-based matching circuits.

It is appreciated by one skilled in the art that matching circuit 600 may be readily modified to operate over a higher frequency range, such as 0-2000 MHz rather than 0-0.2 Hz. In this case, by way of example, L61 preferably has an inductance of approximately 240 pH, L62 an inductance of approximately 380 pH and L63 an inductance of approximately 340 pH. Further by way of example, C61 preferably has a capacitance of approximately 20 pF, C62 a capacitance of approximately 940 pF and C63 a capacitance of approximately 80 pF. The performance of matching circuit 600 over a frequency range of 0-2000 MHz is generally the same as the performance of matching circuit 600 over a frequency range of 0-0.2 Hz illustrated in FIGS. 6B and 6C.

It is a particular feature of a preferred embodiment of the present invention that although the performance of single current path matching circuits of the present invention, such as matching circuit 600, is significantly improved in comparison to that of RFT matching circuits, an intermediate version of the matching circuit of the present invention may nonetheless be developed using well known RFT procedures. The intermediate matching circuit thus generated may then be modified and further optimized by way of the addition of at least one reactive element so as to create a resonant LC circuit along at least one branch. The matching circuit of the present invention thus offers improved performance in comparison to matching circuits designed using RFT, although nonetheless making use of the simplicity and efficiency of design offered by RFT.

Figure 7A:
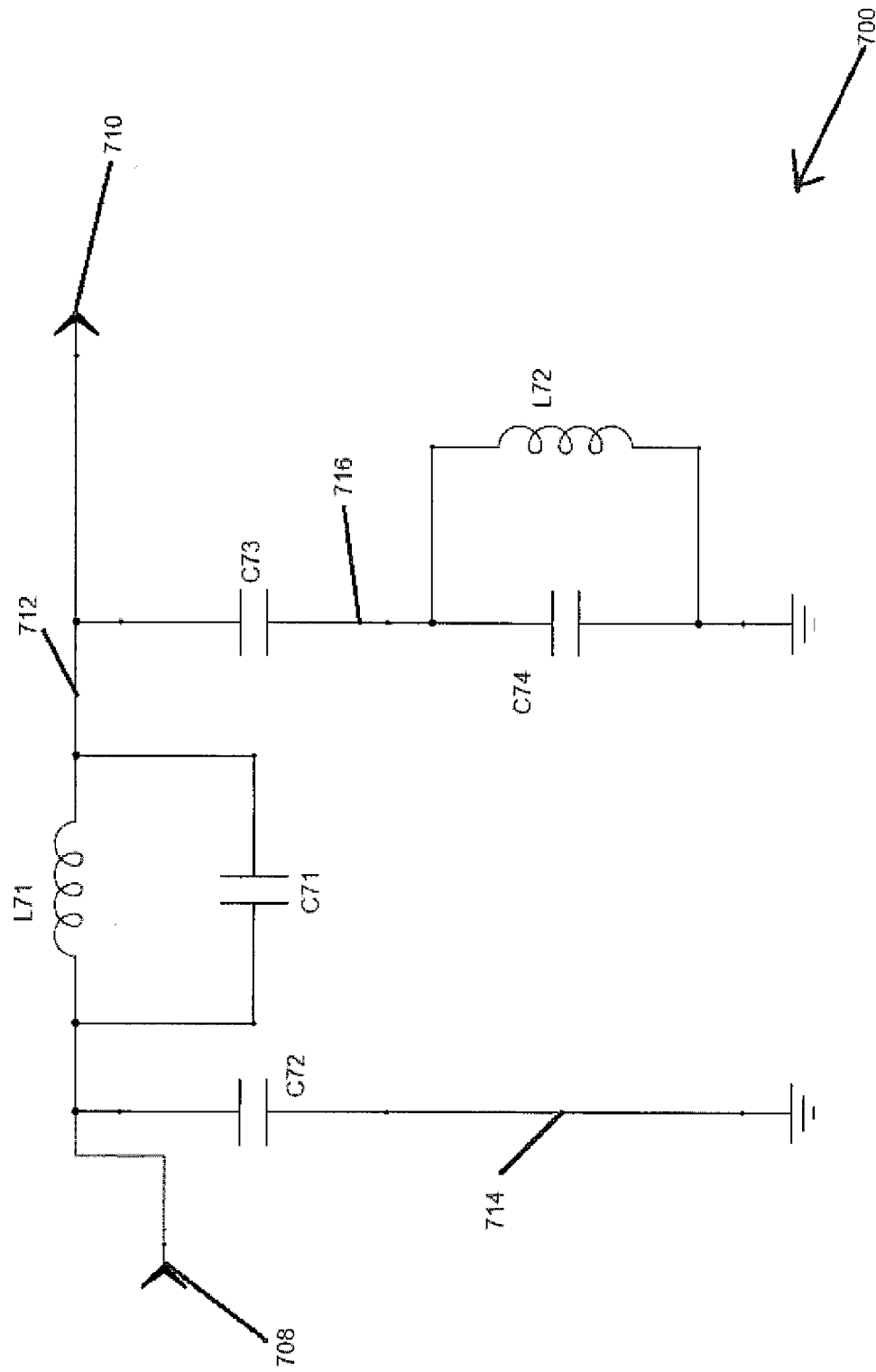
FIG. 7A is a schematic circuit diagram of a matching circuit constructed and operative in accordance with another preferred embodiment of the present invention.
Figure 7C:
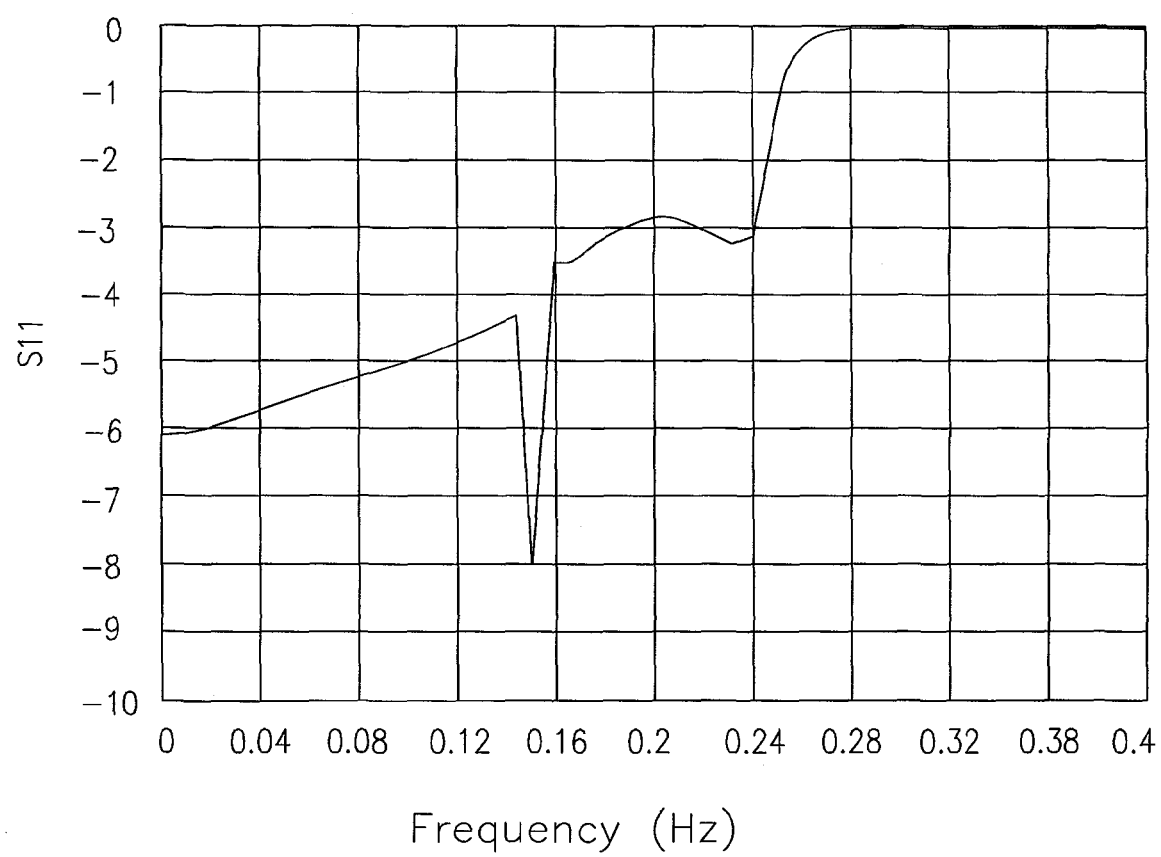

Reference is now made to FIG. 7A which is a schematic circuit diagram of a matching circuit constructed and operative in accordance with a yet further preferred embodiment of the present invention, and to FIGS. 7B and 7C, which are simplified graphs showing performances of a matching circuit of the type shown in FIG. 7A.

As seen in FIG. 7A, there is provided a matching circuit 700 preferably connected to a first, input port 708 and to a second, output port 710. Matching circuit 700 preferably receives an input signal at first port 708 from a signal source (not shown) operative to provide a radio-frequency (RF) signal over a predetermined frequency range. Matching circuit 700 preferably delivers an output signal to second port 710, which output signal is preferably delivered to a load (not shown). Matching circuit 700 is preferably operative to match the impedance of the load to the impedance of the signal source over the predetermined frequency range of the signal source, in order to maximize the energy transfer between the signal source and the load.

Matching circuit 700 preferably includes a first inductor L71 preferably positioned along a first branch 712 thereof and a first capacitor C71 preferably positioned parallel to the first inductor L71. Matching circuit 700 further preferably includes a second capacitor C72 preferably positioned along a first shunt branch 714 thereof and a third capacitor C73, a fourth capacitor C74 and a second inductor L72 preferably positioned along a second shunt branch 716.

Inductors L71 and L72 preferably comprise coils. The respective inductance and capacitance values of inductors L71 and L72 and capacitors C71-C74 are preferably selected in accordance with the impedance values of the source and load to which the source is matched. By way of example, L71 preferably has an inductance of approximately 1.1 H and L72 an inductance of approximately 0.019 H. Further by way of example, C71 preferably has a capacitance of approximately 0.3 F, C72 a capacitance of approximately 0.1 F, C73 a capacitance of approximately 0.4 F and C74 a capacitance of approximately 56.8 F.

Matching circuit 700 is preferably adapted to match a load having an impedance equivalent to that of a circuit comprising an inductor having an inductance of 2.3 H, a shunt capacitor having a capacitance of 1.2 F and a resistor having a resistance of 1Ω. It is understood, however, that matching circuit 700 may be modified by one skilled in the art so as to match loads having a variety of impedances. It is further understood that the above-listed component values of inductors L71 and L72 and capacitors C71-C74 are exemplary only and may be readily scaled according to the frequency range over which matching circuit 700 preferably operates.

As is readily appreciated from consideration of the topology of matching circuit 700, matching circuit 700 preferably provides a single current path, preferably formed by branch 712, between first port 708 and second port 710, and thus between the signal source and the antenna. In this respect, matching circuit 700 preferably differs from matching circuits 100-400, which matching circuits preferably respectively provide multiple current paths between the signal source and the antenna.

Matching circuit 700 preferably includes at least one branch having at least a capacitor and inductor positioned therealong. In the embodiment of the invention illustrated in FIG. 7A, matching circuit 700 includes, by way of example, first branch 712 having L71 and C71 positioned therealong and second shunt branch 716 having C73 and C74 and L72 positioned therealong. Matching circuit 700 is thus distinguished over conventional matching circuits which typically do not include more than one reactive element along a single branch thereof.

In particular, the inclusion of at least a capacitor and inductor along at least one branch of matching circuit 700 serves to distinguish matching circuit 700 over conventional matching circuits designed using RFT. In RFT, the topology of the matching circuit is realized as an LC ladder network by specifying only a single reactive component along each branch thereof.

It is a particular feature of a preferred embodiment of matching circuit 700 that, despite providing only a single current path between the signal source and the load, the real and imaginary parts of the characteristic impedance of matching circuit 700 with respect to the first and second ports 708 and 710 are not defined by the Hilbert transform.

Measured values for the real and imaginary parts of the impedance of matching circuit 700 as seen at the first port 708 and the second port 710 over a frequency range of 0-0.4 Hz are shown in Table 6. As may be calculated by one skilled in the art based on the values displayed in Table 6, the real and imaginary parts of the impedance of matching circuit 700 as seen at first and second ports 708 and 710 are not related by the Hilbert transform.

TABLE 6

| Frequency (MHz) | Real part of impedance (port 1, Ω) | Imaginary part of impedance (port 1, Ω) | Real part of impedance (port 2, Ω) | Imaginary part of impedance (port 1, Ω) |
|---|---|---|---|---|
| 0 | 1 | 0 | 2.981 | 0 |
| 0.008 | 0.999 | 0.089 | 2.973 | −0.145 |
| 0.016 | 0.996 | 0.177 | 2.952 | −0.287 |
| 0.024 | 0.991 | 0.273 | 2.917 | −0.424 |
| 0.032 | 0.986 | 0.377 | 2.869 | −0.555 |
| 0.040 | 0.981 | 0.483 | 2.811 | −0.677 |
| 0.048 | 0.982 | 0.612 | 2.745 | −0.79 |
| 0.056 | 0.986 | 0.747 | 2.671 | −0.892 |
| 0.064 | 0.997 | 0.899 | 2.593 | −0.983 |
| 0.072 | 1.018 | 1.074 | 2.512 | −1.065 |
| 0.080 | 1.047 | 1.266 | 2.431 | −1.136 |
| 0.088 | 1.102 | 1.5 | 2.349 | −1.197 |
| 0.096 | 1.176 | 1.77 | 2.269 | −1.251 |
| 0.104 | 1.286 | 2.076 | 2.192 | −1.297 |
| 0.112 | 1.445 | 2.439 | 2.118 | −1.338 |
| 0.120 | 1.675 | 2.889 | 2.047 | −1.374 |
| 0.128 | 2.04 | 3.413 | 1.978 | −1.407 |
| 0.136 | 2.645 | 4.105 | 1.906 | −1.441 |
| 0.144 | 3.824 | 4.909 | 1.806 | −1.48 |
| 0.152 | 3.426 | −2.71 | 0.78 | −1.331 |
| 0.160 | 6.774 | 7.062 | 1.974 | −1.492 |
| 0.168 | 12.365 | 5.579 | 1.875 | −1.557 |
| 0.176 | 15.415 | −2.557 | 1.827 | −1.619 |
| 0.184 | 9.683 | −8.002 | 1.791 | −1.693 |
| 0.192 | 4.935 | −7.432 | 1.755 | −1.787 |
| 0.200 | 2.645 | −5.791 | 1.705 | −1.904 |
| 0.208 | 1.645 | −4.369 | 1.627 | −2.045 |
| 0.216 | 1.094 | −3.153 | 1.498 | −2.201 |
| 0.224 | 0.804 | −2.062 | 1.302 | −2.345 |
| 0.232 | 0.647 | −0.934 | 1.039 | −2.437 |
| 0.240 | 0.569 | 0.465 | 0.744 | −2.437 |
| 0.248 | 0.606 | 2.589 | 0.472 | −2.341 |
| 0.256 | 0.896 | 7.311 | 0.263 | −2.181 |
| 0.264 | 5.565 | 35.445 | 0.128 | −2 |
| 0.272 | 0.775 | −25.866 | 0.051 | −1.827 |
| 0.280 | 0.032 | −11.571 | 0.014 | −1.677 |
| 0.288 | 1.144e-3 | −8.04 | 1.222e-3 | −1.55 |
| 0.296 | 522e-6 | −6.392 | 1.041e-3 | −1.446 |
| 0.304 | 2.126e-3 | −5.416 | 7.279e-3 | −1.36 |
| 0.312 | 3.235e-3 | −4.759 | 0.016 | −1.288 |
| 0.320 | 3.74e-3 | −4.28 | 0.026 | −1.227 |
| 0.328 | 3.898e-3 | −3.911 | 0.035 | −1.175 |
| 0.336 | 3.783e-3 | −3.615 | 0.044 | −1.13 |
| 0.344 | 3.592e-3 | −3.372 | 0.051 | −1.091 |
| 0.352 | 3.335e-3 | −3.168 | 0.057 | −1.056 |
| 0.360 | 3.042e-3 | −2.992 | 0.063 | −1.025 |
| 0.368 | 2.773e-3 | −2.839 | 0.067 | −0.996 |
| 0.376 | 2.491e-3 | −2.705 | 0.071 | −0.97 |
| 0.384 | 2.246e-3 | −2.585 | 0.074 | −0.946 |
| 0.392 | 2.015e-3 | −2.478 | 0.076 | −0.924 |
| 0.400 | 1.836e-3 | −2.382 | 0.078 | −0.903 |

In operation of matching circuit 700, capacitor-inductor pairs C71 and L71 and C73, C74 and L72 along first branch 712 and second shunt branch 716 form resonant LC circuits. At a very low frequency, below the resonant frequency, the reactance of each inductor tends to zero and the reactance of each capacitor tends to ∞. Each inductor is therefore equivalent to a straight wire and bypasses the reactance of the parallel capacitor. As the frequency increases, the reactance of each capacitor decreases, becoming less negative, and the reactance of each inductor increases. The total reactance along the corresponding branches thus increases. At the resonant frequency of each capacitor-inductor pair, the capacitive reactance of each capacitor is equal and opposite to the inductive reactance of each inductor, leading to ∞ reactance along the corresponding branches and no current therefore passing along those branches. As the frequency increases beyond the resonant frequency, the reactance of each inductor tends ∞ and the reactance of each capacitor tends to zero, leading to a decreased total reactance along the corresponding branches.

It will be appreciated by one skilled in the art that the above-described behavior of capacitor-inductor pairs C71 and L71 and C73, C74 and L72 forming resonant LC circuits resembles that of a switch, since the current directed along branches 712 and 716 varies with the total branch reactance, which total branch reactance varies in turn with the signal frequency.

This intrinsic switch-like behavior of resonant LC branches 712 and 716 serves to widen the bandwidth of matching circuit 700 for a given gain, in comparison to conventional matching circuits. Alternatively stated, the switch-like behavior of resonant LC branches 712 and 716 serves to increase the gain of matching circuit 700 for a given bandwidth, in comparison to conventional matching circuits.

This improvement in performance of matching circuit 700 may be attributed to the switch-like behavior of resonant LC branches 712 and 716 creating regions in the frequency domain over which the reactance of branches 712 and 716 is changing and therefore matching may occur. In this respect, resonant LC branches 712 and 716 act as filters, which filters carry out matching over the frequency regions in which they change from a fully non-conductive to fully-conductive state.

The improved performance of matching circuit 700 may be best appreciated with reference to the graphs shown in FIGS. 7B and 7C. FIG. 7B is a graph showing the voltage gain of the load through the matching circuit 700 and FIG. 7C is a graph showing the return loss of the load through the matching circuit 700. As seen in FIG. 7B, matching circuit 700 exhibits filter-like behavior over the 0-0.4 Hz frequency band, and produces voltage gains of greater than 0.7 over the 0-0.24 Hz range. As seen in FIG. 7C, matching circuit 700 produces low return losses when used in a source-load system.

The wideband performance of matching circuit 700 is particularly advantageous in comparison to the performance of conventional matching circuits designed using RFT. The specific above-described load to be matched by matching circuit 700 was selected since its matching has been previously calculated by Fano (F. M. Fano, 'Theoretical limitations on the broadband matching or arbitrary impedances', J. Franklin Inst., vol. 249, pp. 57-83, January 1960 and pp. 139-155, February 1960) and Carlin (H. J. Carlin, 'A new approach to gain-bandwidth problems', IEEE Trans. Circuits Syst., vol. CAS-24, pp, 170-175, April 1977). Fano showed that for a load with input series L=2.3 H, shunt C=1.2 F and R=1Ω, the maximum theoretical flat power gain achievable over a bandwidth of 0≤ω≥1 is 0.924. Carlin further showed that for such a load, the maximum flat power gain achievable over a bandwidth of 0≤ω≥1 using a matching network designed by RFT is 0.837. The matching network optimized by Carlin using RFT in this case generally resembles matching circuit 700, but without the presence of second inductor L72 and first and fourth capacitors C71 and C74.

In comparison, matching circuit 700 produces voltage gains of greater than 0.7 over a bandwidth of 0-0.24 Hz, as seen in FIG. 7B. It is thus appreciated that by way of a simple modification of Carlin's optimized RFT circuit, namely by way of the addition of second inductor L72 and first and fourth capacitors C71 and C74 forming resonant LC circuits along branches 712 and 716, the performance of matching circuit 700 may be significantly improved in comparison to conventional optimized RFT-based matching circuits.

It is appreciated by one skilled in the art that matching circuit 700 may be readily modified to operate over a higher frequency range, such as 0-2400 MHz rather than 0-0.24 Hz. In this case, by way of example, L71 preferably has an inductance of approximately 110 pH and L72 an inductance of approximately 1.9 pH. Further by way of example, C71 preferably has a capacitance of approximately 30 pF, C72 a capacitance of approximately 10 pF, C73 a capacitance of approximately 40 pF and C74 a capacitance of approximately 5680 pF. The performance of matching circuit 700 over a frequency range of 0-2400 MHz is generally the same as the performance of matching circuit 400 over a frequency range of 0-0.24 Hz illustrated in FIGS. 7B and 7C.

It is a particular feature of a preferred embodiment of the present invention that although the performance of single current path matching circuits of the present invention, such as matching circuit 700, is significantly improved in comparison to that of RFT matching circuits, an intermediate version of the matching circuit of the present invention may nonetheless be developed using well known RFT procedures. The intermediate matching circuit thus generated may then be modified and further optimized by way of the addition of at least one reactive element so as to create a resonant LC circuit along at least one branch. The matching circuit of the present invention thus offers improved performance in comparison to matching circuits designed using RFT, although nonetheless making use of the simplicity and efficiency of design offered by RFT.

Figure 8B:
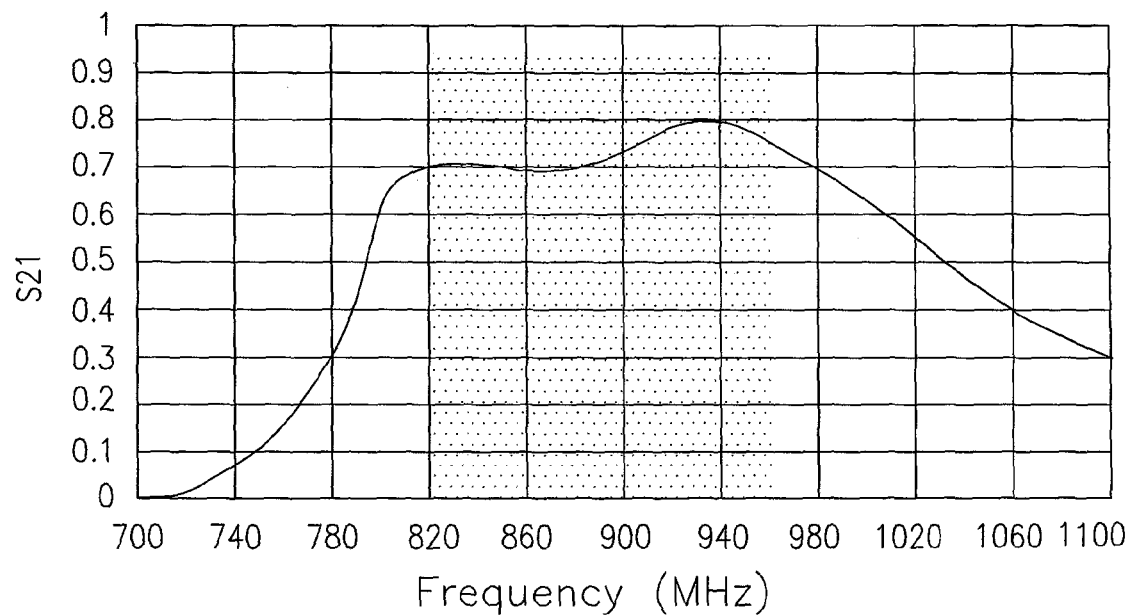
FIGS. 8B and 8C are simplified graphs showing performances of a matching circuit of the type shown in FIG. 8A.
Figure 8C:
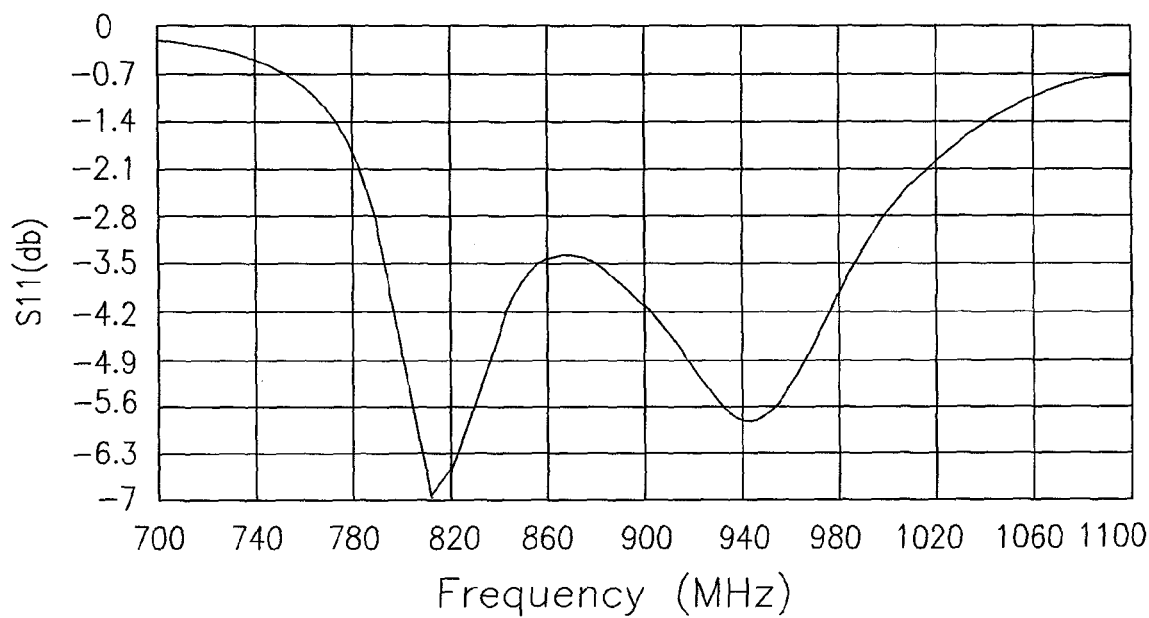

Reference is now made to FIG. 8A which is a schematic circuit diagram of a matching circuit constructed and operative in accordance with another preferred embodiment of the present invention, and to FIGS. 8B and 8C, which are simplified graphs showing performances of a matching circuit of the type shown in FIG. 8A.

As seen in FIG. 8A, there is provided a matching circuit 800, preferably connected to a first, input port 808 and to a second, output port 810. Matching circuit 800 preferably receives an input signal at first port 808 from a signal source (not shown) operative to provide a radio-frequency (RF) signal over a predetermined frequency range. Matching circuit 800 preferably delivers an output signal to second port 810, which output signal is preferably delivered to an antenna (not shown). Matching circuit 800 is preferably operative to match the impedance of the antenna to the impedance of the signal source over the predetermined frequency range of the signal source, in order to maximize the energy transfer between the signal source and the antenna.

Matching circuit 800 preferably includes a first inductor L81 preferably positioned along a first parallel branch 812 thereof and a first capacitor C81 and a second inductor L82 preferably positioned along a second parallel branch 814 thereof. Matching circuit 800 further preferably includes a third inductor L83 preferably positioned along a first shunt branch 816 and a fourth inductor L84 preferably positioned along a second shunt branch 818.

Inductors L81-L84 preferably comprise coils. The respective inductance and capacitance values of inductors L81-L84 and capacitor C81 are preferably selected in accordance with the impedance values of the source and antenna to which the source is matched. By way of example, L81 preferably has an inductance of approximately 81.0 nH, L82 an inductance of approximately 158.8 nH, L83 an inductance of approximately 71.0 nH and L84 an inductance of approximately 24.1 nH. Further by way of example, C81 preferably has a capacitance of approximately 1.6 pF.

Matching circuit 800 is preferably operative to match an electrically short dipole antenna operating over a frequency range of 820-960 MHz. It is understood, however, that matching circuit 800 may be modified by one skilled in the art so as to match antennas having a variety of impedances and operating frequencies.

As is readily appreciated from consideration of the topology of matching circuit 800, matching circuit 800 preferably comprises a multiple branch matching circuit, which multiple branches here include, by way of example, first branch 812 and second branch 814 parallel to the first branch 812. Due to the presence of first and second parallel branches 812 and 814, matching circuit 800 preferably provides multiple current paths between first port 808 and second port 810, and thus between the signal source and the antenna.

The provision by matching circuit 800 of multiple current paths between the signal source and the antenna is a highly advantageous feature of a preferred embodiment of the present invention. This is because the Hilbert transform, which is a function relating the real and the imaginary parts of the impedance of conventional matching circuits, fails in the case of a multiple current path matching circuit. As a result of the inclusion of multiple current paths in matching circuit 800, the real and imaginary parts of the impedance of matching circuit 800 are no longer defined by the Hilbert transform and thus may be more freely selected and optimized.

The provision of multiple current paths by matching circuit 800 is in contrast to conventional matching circuits designed using RFT, which conventional matching circuits typically provide only a single current path having only a single reactive component positioned therealong between the signal source and the antenna. Matching circuits designed using RFT are therefore constrained to have impedances whose real and imaginary parts are defined by the Hilbert transform.

Measured values for the real and imaginary parts of the impedance of matching circuit 800 as seen at the first port 808 and the second port 810 over a frequency range of 700-1100 MHz are shown in Table 7. As may be calculated by one skilled in the art based on the values displayed in Table 7, the real and imaginary parts of the impedance of matching circuit 800 as seen at first and second ports 808 and 810 are not related by the Hilbert transform.

TABLE 7

| Frequency (MHz) | Real part of impedance (port 1, Ω) | Imaginary part of impedance (port 1, Ω) | Real part of impedance (port 2, Ω) | Imaginary part of impedance (port 1, Ω) |
| --- | --- | --- | --- | --- |
| 700 | 2.726 | −66.301 | 2.727 | 271.565 |
| 710 | 2.645 | −59.657 | 2.982 | 277.818 |
| 720 | 2.597 | −53.292 | 3.48 | 284.429 |
| 730 | 2.59 | −47.14 | 4.318 | 291.439 |
| 740 | 2.629 | −41.134 | 5.626 | 298.882 |

TABLE 7-continued

| Frequency (MHz) | Real part of impedance (port 1, Ω) | Imaginary part of impedance (port 1, Ω) | Real part of impedance (port 2, Ω) | Imaginary part of impedance (port 1, Ω) |
|---|---|---|---|---|
| 750 | 2.733 | −35.198 | 7.583 | 306.772 |
| 760 | 2.925 | −29.253 | 10.42 | 315.081 |
| 770 | 3.25 | −23.182 | 14.431 | 323.699 |
| 780 | 3.774 | −16.861 | 19.96 | 332.381 |
| 790 | 4.645 | −10.07 | 27.342 | 340.672 |
| 800 | 6.094 | −2.552 | 36.783 | 347.847 |
| 810 | 8.707 | 6.182 | 48.149 | 352.932 |
| 820 | 13.626 | 16.662 | 60.733 | 354.899 |
| 830 | 24.128 | 29.422 | 73.185 | 353.097 |
| 840 | 47.433 | 41.186 | 83.823 | 347.709 |
| 850 | 90.169 | 28.245 | 91.285 | 339.852 |
| 860 | 98.213 | −27.831 | 95.062 | 331.142 |
| 870 | 61.06 | −51.524 | 95.534 | 323.039 |
| 880 | 36.425 | −46.843 | 93.576 | 316.439 |
| 890 | 23.691 | −37.743 | 90.126 | 311.663 |
| 900 | 17.03 | −29.735 | 85.941 | 308.645 |
| 910 | 13.039 | −22.831 | 81.536 | 307.14 |
| 920 | 10.56 | −17.121 | 77.218 | 306.855 |
| 930 | 8.851 | −12.064 | 73.151 | 307.519 |
| 940 | 7.662 | −7.69 | 69.406 | 308.906 |
| 950 | 6.767 | −3.666 | 66.003 | 310.838 |
| 960 | 6.098 | −0.062 | 62.932 | 313.18 |
| 970 | 5.564 | 3.342 | 60.169 | 315.828 |
| 980 | 5.145 | 6.462 | 57.688 | 318.707 |
| 990 | 4.797 | 9.46 | 55.456 | 321.758 |
| 1000 | 4.514 | 12.251 | 53.447 | 324.939 |
| 1010 | 4.273 | 14.964 | 51.635 | 328.217 |
| 1020 | 4.071 | 17.517 | 49.996 | 331.569 |
| 1030 | 3.896 | 20.018 | 48.51 | 334.977 |
| 1040 | 3.746 | 22.39 | 47.159 | 338.425 |
| 1050 | 3.614 | 24.728 | 45.927 | 341.904 |
| 1060 | 3.499 | 26.957 | 44.801 | 345.405 |
| 1070 | 3.398 | 29.164 | 43.77 | 348.923 |
| 1080 | 3.306 | 31.276 | 42.822 | 352.453 |
| 1090 | 3.227 | 33.376 | 41.949 | 355.99 |
| 1100 | 3.153 | 35.392 | 41.143 | 359.532 |

Matching circuit 800 preferably includes at least one branch having at least a capacitor and inductor there along. In the embodiment of the invention illustrated in FIG. 8A, matching circuit 800 includes, by way of example, second parallel branch 814 having C81 and L82 positioned therealong.

The enhanced performance of matching circuit 800 may be attributed to the switch-like behavior of resonant LC branch 814 creating regions in the frequency domain over which the reactance of branch 814 is changing and therefore matching may occur. In this respect, resonant LC branch 814 of matching circuit 800 acts as a filter, which filter carries out matching over the frequency region in which it changes from a fully non-conductive to fully-conductive state.

The improved performance of matching circuit 800 may be best appreciated with reference to the graphs shown in FIGS. 8B and 8C. FIG. 8B is a graph showing the voltage gain of the antenna through the matching circuit 800 and FIG. 8C is a graph showing the return loss of the antenna through the matching circuit 800. As seen in FIG. 8B, matching circuit 800 exhibits filter-like behavior over the 700-1100 MHz band, and produces voltage gains between approximately 0.7-0.8 in the 820-960 MHz range. As seen in FIG. 8C, matching circuit 800 produces low return losses when used in an antenna system.

The wideband performance of matching circuit 800 is particularly advantageous in comparison to the performance of conventional matching circuits designed using RFT. Matching circuits designed using RFT have a flat gain, in comparison to the varying gain of matching circuit 800 seen in FIG. 8B, which flat gain is lower and spans a narrower bandwidth that the gain and bandwidth produced by matching circuit 800.

Reference is now made to FIGS. 9A, 9B, 9C and 9D, which are schematic circuit diagrams of alternative preferred embodiments of circuit structures useful in a matching circuit of any of the types illustrated in FIGS. 1-8A, constructed and operative in accordance with a preferred embodiment of the present invention.

As seen in FIGS. 9A-9D, there are provided four alternative circuit structures 900, 902, 904 and 906. Each one of circuit structures 900-906 preferably comprises an arrangement of at least one inductor and at least one capacitor preferably operative as a self-switching resonant LC circuit. It is appreciated that one or more of circuit structures 900-906 may be incorporated in any one of the matching circuits of the present invention described with reference to FIGS. 1-8A, in order to improve the performance of the matching circuit. It is further appreciated that one or more of circuit structures 900-906 may be added to any appropriate conventional matching circuit, including matching circuits designed using RFT, thereby improving the performance of such matching circuits and preferably altering the real and imaginary parts of the impedance thereof, such that the real and imaginary parts are no longer defined by the Hilbert transform.

As seen in FIG. 9A, circuit structure 900 preferably comprises a serial arrangement of an inductor L91 and a capacitor C91. The impedance Z of circuit structure 900 is given by:

$$Z=(L91*C91*(s^2+1))/C91*s$$

where $s=j2\pi f$ and f is the frequency.

As seen in FIG. 9B, circuit structure 902 preferably comprises a parallel arrangement of an inductor L92 and a capacitor C92. The impedance Z of circuit structure 902 is given by:

$$Z=L92*s/(L92*C92*(s^2+1))$$

where $s=j2\pi f$ and f is the frequency.

As seen in FIG. 9C, circuit structure 904 preferably comprises a parallel arrangement of an inductor L93 and a capacitor C93 with an additional capacitor C94 in series therewith. The impedance Z of circuit structure 904 is given by:

$$Z=[((L93*C94)+C93)*(s^2+1))]/[s*(L93*C94*C93*(s^2+C94))]$$

where $s=j2\pi f$ and f is the frequency.

As seen in FIG. 9D, circuit structure 906 preferably comprises a parallel arrangement of an inductor L95 and a capacitor C95 with an additional inductor L96 in series therewith. The impedance Z of circuit structure 906 is given by:

$$Z=s*[L96*L95*C95*s^2+(L96+L95)]/(L95*C95*s+1)$$

where $s=j2\pi f$ and f is the frequency.

It will be appreciated by persons skilled in the art that the present invention is not limited by what has been particularly claimed hereinbelow. Rather, the scope of the invention includes various combinations and subcombinations of the features described hereinabove as well as modifications and variations thereof as would occur to persons skilled in the art upon reading the forgoing description with reference to the drawings and which are not in the prior art.

The invention claimed is:

1. An antenna system comprising:
    a signal source;
    at least one antenna coupled to said signal source; and
    a matching circuit connected to said signal source at a first port and to said at least one antenna at a second port and operative to match said at least one antenna to said signal source, said matching circuit having a characteristic impedance with respect to said first port and said second port, real and imaginary parts of said characteristic impedance not being defined by the Hilbert transform, wherein said matching circuit comprises at least two branches providing multiple current paths between said signal source and said at least one antenna, at least one of said at least two branches comprises at least one inductor and capacitor, said at least one inductor and capacitor comprises one inductor and one capacitor connected in series and operative as a resonant inductor-capacitor circuit, and an impedance of said one inductor and one capacitor connected in series is given by $(L*C*(s^2+1))/C*s$, where L is an inductance of said inductor, C is a capacitance of said capacitor and $s=j\pi f$, where f is a frequency of operation of said signal source.

2. An antenna system according to claim 1, wherein said multiple current paths comprise parallel paths.

3. An antenna system comprising:
a signal source;
at least one antenna coupled to said signal source; and
a matching circuit connected to said signal source at a first port and to said at least one antenna at a second port and operative to match said at least one antenna to said signal source, said matching circuit having a characteristic impedance with respect to said first port and said second port, real and imaginary parts of said characteristic impedance not being defined by the Hilbert transform, wherein said matching circuit comprises at least two branches providing multiple current paths between said signal source and said at least one antenna, at least one of said at least two branches comprises at least one inductor and capacitor, said at least one inductor and capacitor comprises one inductor and one capacitor connected in parallel and operative as a resonant inductor-capacitor circuit, and an impedance of said one inductor and one capacitor connected in parallel is given by $L*s/(L*C*(s_2+1))$ where L is an inductance of said inductor, C is a capacitance of said capacitor and $s=j2\pi f$, where f is a frequency of operation of said signal source.

4. An antenna system comprising:
a signal source;
at least one antenna coupled to said signal source; and
a matching circuit connected to said signal source at a first port and to said at least one antenna at a second port and operative to match said at least one antenna to said signal source, said matching circuit having a characteristic impedance with respect to said first port and said second port, real and imaginary parts of said characteristic impedance not being defined by the Hilbert transform, wherein said matching circuit comprises at least two branches providing multiple current paths between said signal source and said at least one antenna, at least one of said at least two branches comprises at least one inductor and capacitor, said at least one inductor and capacitor comprises an inductor and a first capacitor connected in parallel and a second capacitor connected in series therewith, said inductor, first capacitor and second capacitor being operative as a resonant inductor-capacitor circuit, and an impedance of said inductor, first capacitor and second capacitor is given by $[((L*C2)+C1)*(s^2+1))]/[s*(L*C2*C1*2(s^2+C1))]$ where L is an inductance of said inductor, C1 is a capacitance of said first capacitor, C2 is a capacitance of said second capacitor and $s=j2\pi f$, where f is a frequency of operation of said signal source.

5. An antenna system comprising:
a signal source;
at least one antenna coupled to said signal source; and
a matching circuit connected to said signal source at a first port and to said at least one antenna at a second port and operative to match said at least one antenna to said signal source, said matching circuit having a characteristic impedance with respect to said first port and said second port, real and imaginary parts of said characteristic impedance not being defined by the Hilbert transform, wherein said matching circuit comprises at least two branches providing multiple current paths between said signal source and said at least one antenna, at least one of said at least two branches comprises at least one inductor and capacitor, said at least one inductor and capacitor comprises an inductor and a first capacitor connected in parallel and a second capacitor connected in series therewith, said inductor, first capacitor and second capacitor being operative as a resonant inductor-capacitor circuit, said at least one inductor and capacitor comprises a first inductor and a capacitor connected in parallel and a second inductor connected in series therewith, said first inductor, capacitor and second inductor being operative as a resonant inductor-capacitor circuit, and an impedance of said first inductor, capacitor and second inductor is given by $Z=s*[L2*L1*C*s^2+(L1+L2)]/(L1*C*s+1)$ where L1 is an inductance of said first inductor, C is a capacitance of said capacitor, L2 is an inductance of said second inductor and $s=j2\pi f$, where f is a frequency of operation of said signal source.

6. An antenna system comprising:
a signal source operative to provide a radio-frequency signal over a predetermined frequency range, said predetermined frequency range comprising a plurality of frequency sub-ranges;
at least one antenna coupled to said signal source; and
a matching circuit coupled to said at least one antenna and to said signal source and operative to match said at least one antenna to said signal source, said at least one matching circuit comprising at least two parallel branches, at least one of said at least two parallel branches comprising at least one inductor and capacitor, each one of said at least two parallel branches being operative to match said at least one antenna to said signal source in at least one frequency sub-range of said plurality of frequency sub-ranges, without switches, wherein said at least one inductor and capacitor comprises one inductor and one capacitor connected in series and operative as a resonant inductor-capacitor circuit, and an impedance of said one inductor and one capacitor connected in series is given by $(L*C*(s^2+1))/C*s$, where L is an inductance of said inductor, C is a capacitance of said capacitor and $s=j2\pi f$, where f is a frequency of operation of said signal source.

7. An antenna system according to claim 6, wherein said matching circuit comprises a multiband matching circuit.

8. An antenna system comprising:
a signal source operative to provide a radio-frequency signal over a predetermined frequency range, said predetermined frequency range comprising a plurality of frequency sub-ranges;
at least one antenna coupled to said signal source; and
a matching circuit coupled to said at least one antenna and to said signal source and operative to match said at least one antenna to said signal source, said at least one matching circuit comprising at least two parallel branches, at least one of said at least two parallel branches comprising at least one inductor and capacitor, each one of said at least two parallel branches being operative to match said at least one antenna to said signal source in at least one frequency sub-range of said plurality of frequency sub-ranges, without switches,
wherein said at least one inductor and capacitor comprises one inductor and one capacitor connected in parallel and operative as a resonant inductor-capacitor circuit, and
an impedance of said one inductor and one capacitor connected in parallel is given by $L*s/(L*C*(s^2+1))$ where L is an inductance of said inductor, C is a capacitance of said capacitor and $s=j2\pi f$, where f is a frequency of operation of said signal source.

9. An antenna system according to claim 6, wherein said at least one inductor and capacitor comprises an inductor and a first capacitor connected in parallel and a second capacitor connected in series therewith, said inductor, first capacitor and second capacitor being operative as a resonant inductor-capacitor circuit.

10. A source-load system comprising:
a signal source;
at least one load coupled to said signal source; and
a matching circuit connected to said signal source at a first port and to said at least one load at a second port and operative to match said at least one load to said signal source, said matching circuit having a characteristic impedance with respect to said first port and said second port, real and imaginary parts of said characteristic impedance not being defined by the Hilbert transform,
wherein said matching circuit comprises at least two branches providing multiple current paths between said signal source and said at least one load,
at least one of said at least two branches comprises at least one inductor and capacitor,
said at least one inductor and capacitor comprises one inductor and one capacitor connected in series and operative as a resonant inductor-capacitor circuit, and
an impedance of said one inductor and one capacitor connected in series is given by $(L*C*(s^2+1))/C*s$, where L is an inductance of said inductor, C is a capacitance of said capacitor and $s=j2\pi f$, where f is a frequency of operation of said signal source.

* * * * *